United States Patent [19]

Nagata et al.

[11] 4,200,841
[45] Apr. 29, 1980

[54] PRESET TUNING APPARATUS USING FLOATING GATE TYPE FIELD EFFECT DEVICE

[75] Inventors: Yoshinosuke Nagata, Kobe; Hiroshi Kutsuyama, Kadoma; Makoto Yamada, Katano; Kazuyoshi Tsukamoto, Neyagawa, all of Japan

[73] Assignee: Sanyo Electric Co., Ltd., Moriguchi, Japan

[21] Appl. No.: 950,453

[22] Filed: Oct. 11, 1978

[30] Foreign Application Priority Data

Oct. 14, 1977 [JP] Japan .................. 52-124197

[51] Int. Cl.$^2$ ............................................... H04B 1/34
[52] U.S. Cl. .................... 455/169; 307/238; 334/15; 365/185; 455/261
[58] Field of Search ............... 325/464, 468, 465, 470, 325/451, 452, 453, 457, 423, 422, 469; 334/15, 16, 18; 307/238, 246; 357/23, 41; 365/185

[56] References Cited

U.S. PATENT DOCUMENTS

| | | | |
|---|---|---|---|
| 3,967,057 | 6/1976 | Tsukamoto et al. | 325/423 |
| 3,986,154 | 10/1976 | Yamada et al. | 325/464 |
| 4,004,159 | 1/1977 | Rai | 307/238 |
| 4,008,437 | 2/1977 | Sakaughi et al. | 325/470 |
| 4,020,420 | 4/1977 | Minami | 455/185 |

*Primary Examiner*—Benedict V. Safourek
*Assistant Examiner*—Tommy P. Chin
*Attorney, Agent, or Firm*—Darby & Darby

[57] ABSTRACT

A preset tuning apparatus adapted for selecting a preset channel among a plurality of channels, comprising a tuner including a tuning circuit including a voltage controlled variable capacitance diode, a manually adjustable tuning voltage generator for providing a tuning voltage to the voltage controlled variable capacitance diode, a non-volatile analog storage including a plurality of floating gate type field effect memory devices, a band selection switch, a preset selection switch, a preset memory switch, addressing circuits coupled to the band selection and preset selection switches for addressing a corresponding one of the plurality of memory devices, an erase/write/read voltage generator, and a mode control coupled to the erase/write/read voltage generator and responsive to the band selection, preset selection and preset memory switches for alternately and repetitively writing and reading the analog value in the addressed memory device until the data corresponding to the tuning voltage of the tuning voltage generator is written in the memory device in the write and read modes and for reading thereafter the data in the memory device for providing the same as a tuning voltage to the voltage controlled variable capacitance diode in the preset mode, whereby the preset selection is achieved based on the data as written in and read out from the addressed memory device. Preferably, the data concerning the tuning voltage is divided into a rough tuning voltage and a fine tuning voltage, which are separately stored in separate memory devices. Preferably, the read tuning voltage is once stored in a buffer memory and the tuning voltage in the buffer memory is corrected responsive to an automatic frequency control signal.

22 Claims, 20 Drawing Figures

ERASE MODE

READ MODE

WRITE MODE (a) ERASE MODE (b) MEMORY PERIOD (c) WRITE MODE (d) READ MODE (e) STOP

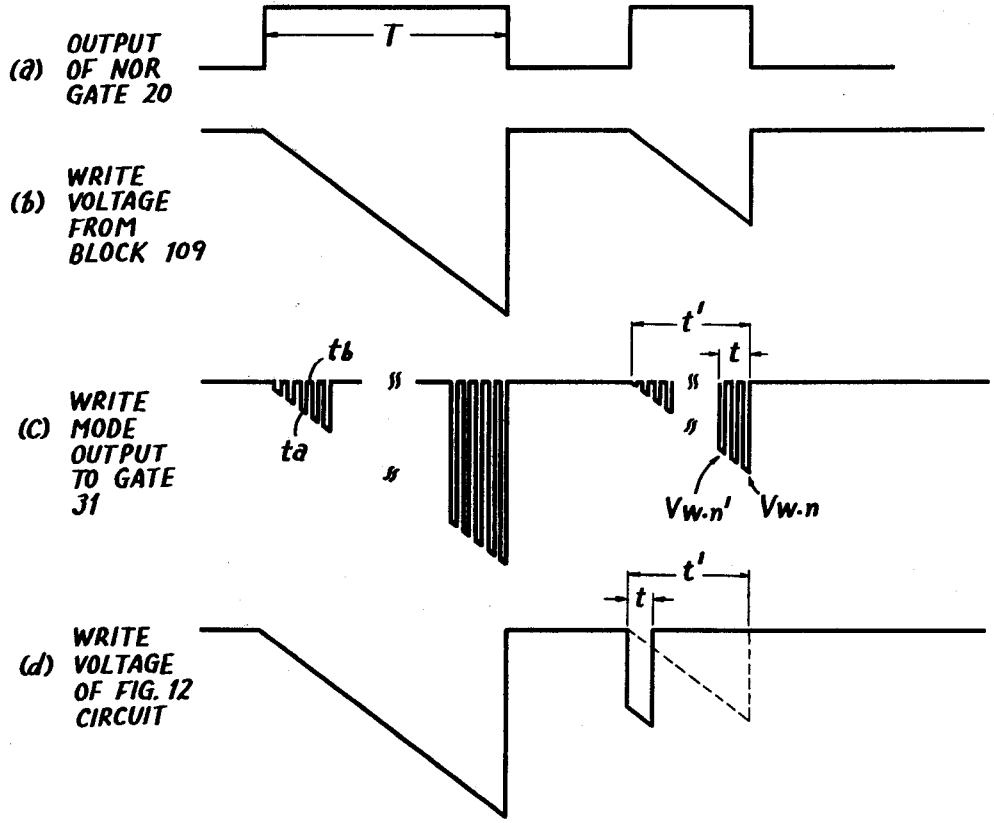
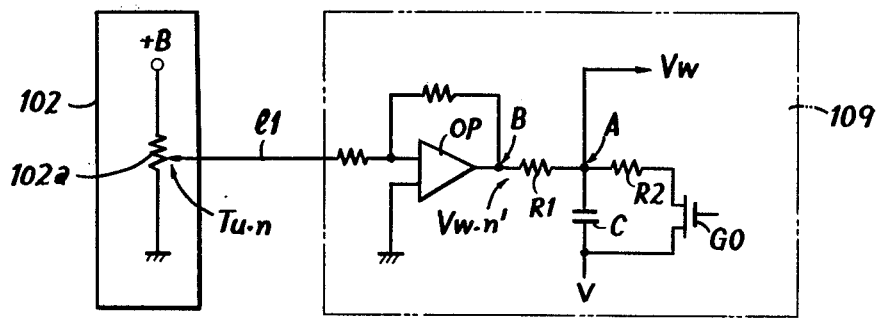

PRESET TUNING APPARATUS USING FLOATING GATE TYPE FIELD EFFECT DEVICE

BACKGROUND OF THE INVENTION

1. Field of the Invention

The present invention relates to a present tuning apparatus adapted for selecting a desired preset channel. More specifically, the present invention relates to a preset tuning apparatus for selecting a desired preset channel employing a non-volatile analog storage means for storing information concerning a tuning voltage to be applied to a voltage controlled variable reactance device of a tuner.

2. Description of the Prior Art

In reception of the radio broadcasting wave, it is necessary to select a desired broadcasting frequency or channel out of a plurality of radio broadcasting frequencies or channels allotted to different broadcasting stations. A typical prior art preset tuning apparatus adapted for selecting a desired preset channel among a plurality of preset channels is a multi-circuit push-button switch. However, a push-button switch usually makes a circuit through a mechanical touch between paired contacts performed by a manual operation. For this reason, a push-button switch always suffers from a poor electrical contact between the paired contacts caused by deterioration of the contact surfaces.

A tuning apparatus for selecting broadcasting channels or frequencies employing a voltage controlled variable capacitor has also being proposed and put in practical use. Such a voltage controlled variable capacitor utilizes a capacitance formed at a barrier portion of a diode, variable as a function of a reverse voltage applied thereto, and is also known as a variable capacitance diode. In such a tuning apparatus, it is necessary to provide a voltage supply capable of providing a plurality of different tuning voltages in response to a manual operation, each corresponding to a voltage value which causes a capacitance value with which the tuning apparatus selects a desired corresponding channel or frequency.

One type of such a voltage supply for providing a plurality of different voltages comprises a reference voltage source and a plurality of potential dividers for dividing the reference voltage of the voltage source and a switching circuit selectively operable in response to selecting manual operation for withdrawing a corresponding one of the divided voltages. However, such a voltage supply typically comprises a series connection of a plurality of voltage dividing resistors and a switching circuit coupled to each of the junctions of the resistors. Since the resistance value of each voltage dividing resistor determines the output voltage, it is required that the resistance value of each of the voltage dividing resistors be precisely selected. Thus, the above described voltage supply becomes complicated in structure and difficult to implement. In addition, in spite of a recent trend of minituarization of various electronic apparatuses, the above described voltage supply is also difficult to make compact.

A tuning apparatus of interest in connection with the present invention is disclosed in U.S. Pat. No. 3,965,288 issued June 22, 1976; U.S. Pat. No. 3,967,057 issued June 29, 1976; U.S. Pat. No. 3,986,154 issued Oct. 12, 1976 and U.S. Pat. No. 4,008,437 issued Feb. 15, 1977, all assigned to the same assignee as the present invention. These patents describe utilization of an improved non-volatile analog storage means as a voltage source for providing a tuning voltage to be applied to a voltage controlled variable capacitance device included in a tuning apparatus. More specifically, the above referenced patents describe the use of an electrochemical potential memory device by the use of a solid state electrolyte as a non-volatile analog storage means. This electrochemical potential memory device compriese an Ag electrode as a cathode, an Ag-Te alloy electrode as an anode, and a solid state electrolyte having high ion conductivity such as $RbAg_4I_5$ sandwiched between both electrodes. When a direct current voltage is applied to the device so that the Ag electrode may be negative, a portion of Ag contained in the Ag-Te alloy electrode migrates over to the Ag electrode, resulting in a decreased activity of Ag in the Ag-Te alloy, and thus an increased potential difference between both electrodes. Thus, this device makes it possible to effect write-in and non-destructive read-out operation and in addition it can hold the memory condition for a relatively longer period of time. Nevertheless, in view of the expensive cost of the above described memory device, it is difficult to employ this memory device in a preset tuning apparatus.

As to be more fully described subsequently, the present invention makes it possible to employ a floating gate type field effect semiconductor memory device as a non-volatile analog storage means for storing information concerning a tuning voltage to be applied to a voltage controlled variable capacitance device employed in a preset tuning apparatus. A floating gate type field effect semiconductor memory device is well known by itself. For example, a typical floating gate type non-volatile semiconductor memory device is disclosed in U.S. Pat. No. 4,004,159, entitled "Electrically Reprogrammable Non-Volatile Floating Gate Semiconductor Memory Device and Method of Operation" and issued Jan. 18, 1977 to the same assignee as the present invention. Typically, the floating gate type non-volatile semiconductor memory device has been utilized as a memory device for storing digital or logical information. It would be extremely advantageous, if a floating gate type field effect semiconductor memory device could be utilized as a non-volatile analog storage means for storing analog information concerning a tuning voltage to be applied to a voltage controlled variable capacitance device employed in a preset tuning apparatus. The present invention is aimed to provide such possibility.

SUMMARY OF THE INVENTION

Briefly described, the present invention utilizes a floating gate type field effect semiconductor memory device as a non-volatile analog storage means for storing analog information concerning a tuning voltage to be applied to a voltage controlled variable capacitance device employed in a preset tuning apparatus. A floating gate type field effect semiconductor memory device typically comprises a semiconductor substrate of one conductivity type having a main surface, source and drain regions of the opposite conductivity type spaced apart on the main surface of the semiconductor substrate, a first insulating layer formed on the main surface of the semiconductor substrate at least in an area between the source and drain regions, a floating gate electrode formed on the first insulating layer above he area on the main surface between the source and drain regions, a second insulating layer formed on the floating gate electrode, and a control gate electrode formed opposite to the floating gate electrode, on the second insulating layer. It is well known that the semiconductor memory device exhibits a change in the control gate electrode versus drain current characteristic as a function of the type and quantity of electric charge applied to the floating gate electrode.

In order to make it possible to utilize a floating gate type field effect semiconductor memory device as a non-volatile analog storage means in a preset tuning apparatus, the inventive preset tuning apparatus comprises first voltage applying means for selectively applying an erase voltage to the semiconductor memory device in an erase operation mode for causing a first change to a predetermined value in one direction in quantity of electric charge applied to the floating gate electrode, whereby a respective first change in the control gate voltage versus drain current characteristic of the semiconductor memory device is caused, second voltage applying means for selectively applying a write voltage to the semiconductor memory device in a write operation mode for causing a second change to a value to be preset in the opposite direction in quantity of electric charge applied to the floating gate electrode, whereby a respective second change in the control gate voltge versus drain current characteristic of the semiconductor memory device is caused, the second change being associated with the value being preset in quantity of electric charge and being in the direction opposite to the first change, third voltage applying means for selectively applying a read voltage to the semiconductor memory device in a read operation mode for withdrawing an analog electrical signal representative of a drain current determinable as a function of the value being preset in quantity of electric charge in the floating gate electrode in terms of the control gate voltage versus drain current characteristic of the semiconductor memory device, first tuning voltage providing means operatively coupled to the third voltage applying means for providing a first tuning voltage associated with the analog electrical signal representative of a drain current determinable as a function of the value being preset in quantity of electric charge in the floating gate electrode in terms of the control gate voltag versus drain current characteristic of the semiconductor memory device, and tuning means comprising voltage controlled variable reactance means connected to receive the first tuning voltage from the first tuning voltage providing means, the value being preset being preselected for enabling selection by the tuning means of the preset channel.

In a preferred embodiment, the inventive preset tuning apparatus further comprises second tuning voltage providing means for selectively providing a second tuning voltage to the voltage controlled variable reactance means of the tuning means, and means coupled to the second tuning voltage providing means for changing the second tuning voltage selectively provided to the voltage controlled variable reactance means for enabling selection of a desired channel by the tuning means.

In a further preferred embodiment, the inventive present tuning apparatus further comprises means responsive to the first tuning voltage from the first tuning voltage providing means and the second tuning voltage from the second tuning voltage providing means for controlling the second voltage applying means for selectively applying a write voltage to the semiconductor memory device for causing the second change in quantity of electric charge applied to the floating gate electrode to a value corresponding to the first tuning voltage. Preferably, the above described means for controlling the second voltage applying means for selectively applying a write voltage comprises alternative and repetitive control means for controlling the second write voltage applying means and the third read voltage applying means for alternatively and repetitively causing the write operation mode and the read operation mode for a predetermined short time period for each mode, the second write voltage applying means being adapted such that a predetermined small value of the second change in quantity of electric charge is caused in each write operation mode period, and means responsive to the first and second tuning voltage for detecting coincidence of the first and second tuning voltage for disabling the above described alternate and repetitive control means.

More preferably, the inventive preset tuning apparatus is adapted for selecting a desired preset channel among a plurality of preset channels. To that end, the non-volatile analog storage means of the inventive preset tuning apparatus comprises a plurality of floating gate type field effect semiconductor memory device allotted to the plurality of channels and further comprises channel selecting means and means responsive to the channel selecting means for addressing a corresponding one of the plurality of semiconductor memory devices. The plurality of semiconductor memory devices may be divided into two or more groups, each allotted to a frequency band, and the inventive preset tuning apparatus may further comprise means responsive to band selection for addressing a corresponding one of the plurality of groups of the semiconductor memory devices. The above described addressing means may comprise switching means, typically implemented by field effect devices. Thus, a plurality of non-volatile semiconductor memory devices for storing analog information and a plurality of field effect devices for addressing purpose may be implemented in an integrated circuit.

Preferably, first value data representing in a rough manner an approximate value of the second tuning voltage and second value data representing in a fine manner the difference between the actual value of the second tuning voltage and the approximate value of the second tuning voltage are provided based on the second tuning voltage and the first value data is stored in a further storage means, while the second value data is stored in the non-volatile analog storage means. Means is provided coupled to the further storage means for providing a further voltage associated with the first value data. The further voltage is incorporated into the first tuning voltage by means of an adding means. According to such embodiment, the data concerning the tuning voltage is stored in a rough data memory and a fine data memory. As a result, the non-volatile analog storage means for storing the fine data can be implemented in a simple structure.

According to a further preferred embodiment, a voltage storing means is provided for selectively storing the first tuning voltage or the second tuning voltage and the stored voltage in the voltage storing means is applied to the voltage controlled variable reactance means of the tuning means. As a result, a re-write operation or a refresh operation can be achieved by the use of the voltage storing means. The voltage storing means can also be advantageously utilized for the purpose of automatic frequency control.

Accordingly, a principal object of the present invention is to provide a compact and inexpensive preset tuning apparatus.

Another object of the present invention is to make it possible to employ a floating gate type field effect semiconductor memory device as a non-volatile analog storage means for storing information concerning a tuning voltage to be applied to a voltage to be applied to a voltage controlled variable capacitance device employed in a preset tuning apparatus.

A further object of the present invention is to provide an improved scheme for loading in a floating gate type field effect semiconductor memory device information concerning a tuning voltage to be applied to a voltage controlled variable capacitance device employed in a preset tuning apparatus.

Still a further object of the present invention is to provide an improved preset tuning apparatus, wherein non-volatile analog storage means for storing information concerning a tuning voltage to be applied to a voltage controlled variable reactance device employed in a preset tuning apparatus and addressing means for addressing the non-volatile analog storage means are implemented in a solid state.

It is an object of the present invention to provide an improved preset tuning apparatus, wherein non-volatile analog storage means or storing information concerning a tuning voltage to be applied to a voltage controlled variable reactance device employed in a preset tuning apparatus can be simplified in structure.

It is a further object of the present invention to provide an improved preset tuning apparatus, wherein non-volatile analog storage means for storing information concerning a tuning voltage to be applied to a voltage controlled variable reactance device employed in a preset tuning apparatus is adapted to undergo a re-write operation or a refresh operation.

These objects and other objects, features, aspects nd advantages of the present invention will become more apparent from the following detailed description of the present invention when taken in conjunction with the accompanying drawings.

BRIEF DESCRIPTION OF THE DRAWINGS

FIG. 11 shows waveforms for explanation of the write voltage;

FIG. 12 shows a schematic diagram of a preferred embodiment of the sawtooth wave write voltage generator;

DESCRIPTION OF THE PREFERRED EMBODIMENTS

As described previously, the inventive preset tuning apparatus employs a floating gate type field effect semiconductor memory device as non-volatile analog storage means for storing information concerning a tuning voltage to be applied to a voltage controlled variable reactance device included in the inventive preset tuning apparatus. Therefore, at the outset a floating gate type field effect semiconductor memory device will be described in detail. As described previously, a floating gate type field effect semiconductor memory device for digital application has been fully described in U.S. Pat. No. 4,004,159, entitled "Electrically Reprogrammable Non-Volatile Floating Gate Semiconductor Memory Device And Method Of Operation" issued Jan. 18, 1978 and assigned to the same assignee as the present invention. Since the basic structure of a floating gate type field effect semiconductor memory device for use in the inventive preset tuning apparatus is substantially the same as that disclosed in the referenced patent, the referenced patent is incorporated herein by reference thereto, insofar as the same is applicable to the present invention.

Figure 1:
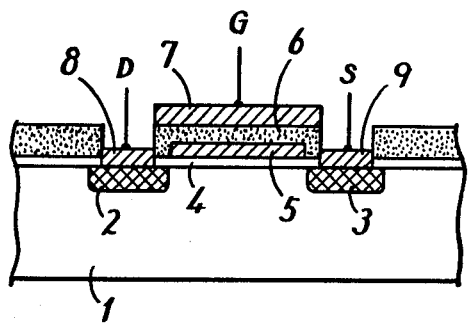
FIG. 1 is a cross sectional view of a typical prior art floating gate type non-volatile semiconductor memory device.

FIG. 1 is a crosssectional view of a typical prior art floating gate type non-volatile semiconductor memory device. The device of FIG. 1 comprises a semiconductor substrate 1 of a certain conductivity type such as an N type silicon substrate, a source region 3 and a drain region 2 of, for example, an opposite conductivity type or P type formed in the surface thereof, and a composite layer of metallic and insulating films formed on the substrate 1. More specifically, a first insulation layer 4 of a silicon dioxide ($SiO_2$) is formed, extending on a spacing between both regions 2 and 3, and furthermore a floating gate 5 is deposited thereon. As a material constituting the floating gate 5, a metallic film of molybdenum, a film of a semiconductor such as polycrystalline silicon doped in large quantities of impurities such as phosphorous, boron, and the like may be used. The device of FIG. 1 further comprises a second insulation layer 6 of silicon nitride ($Si_3N_4$) deposited on the floating gate 5, a control gate electrode 7 deposited on the silicon nitride layer 6, source and drain electrodes 8 and 9 which are formed in contact with the source and drain regions 3 and 2 respectively.

In erasing information from the memory device of such structure, the floating gate 5 is charged with the positive electric charge, by expelling electrons from the floating gate 5, for example, whereby the characteristic curve in the control gate voltage versus drain current characteristic is shifted in the negative direction and thus the threshold voltage of the field effect device is accordingly shifted in the negative direction. On the other hand, in writing information in the semiconductor memory device of such structure, the floating gate is charged with the negative electric charge, by introducing electrons into the floating gate 5, for example, whereby the characteristic curve in the control gate voltage versus drain current characteristic is shifted in the positive direction and thus the threshold voltage of the field effect device is accordingly shifted in the positive direction.

Figure 2:
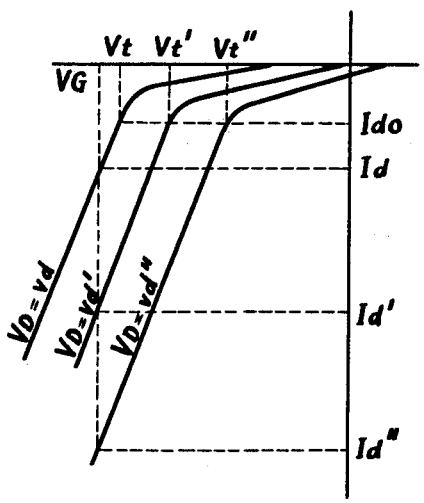
FIG. 2 is a characteristic curve graph showing the control gate voltage versus drain current characteristic, with the quantity of electric charge in the floating gate as a parameter.
Figure 3:
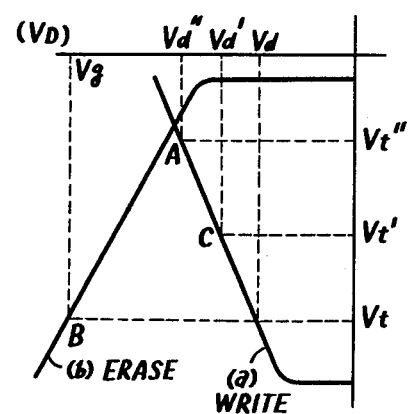
FIG. 3 is a characteristic curve graph showing the erase and write voltage versus the control gate voltage characteristic.

FIG. 2 is a characteristic curve graph showing the control gate voltage versus drain current characteristic, with the quantity of electric charge in the floating gate as a parameter, wherein the abscissa indicates the control gate voltage and ordinate indicates the drain current. On the other hand, FIG. 3 is a characteristic curve graph showing the erase and write voltage versus the control gate threshold voltage characteristic, wherein the abscissa indicates the erase and write voltage and the ordinate indicates the control gate threshold voltage, the curve a exhibiting the write characteristic and the curve b exhibiting the erase characteristic. Briefly described, FIG. 2 shows a read characteristic and hence may be referred to in consideration of a read operation, while FIG. 3 shows an erase/write characteristic of the semiconductor memory device and may be referred to in consideration of the erase and write operation of the semiconductor memory device.

Typically an erase operation is achieved by the use of the Fowler-Nordheim tunnel effect of electrons from the floating gate 5 toward the silicon substrate, whereby the floating gate 5 is charged in the positive direction to a given value of quantity of electric charge, while a write operation is achieved by an avalanche injection of electrons from the drain region 2 toward the floating gate 5, whereby the floating gate 5 is charged in the negative direction to another given value of quantity of electric charge.

Figure 4A:
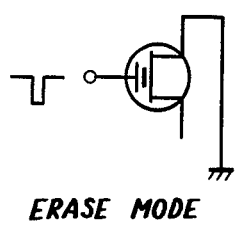
FIG. 4A shows a connection of the electrodes of the semiconductor memory device in the erase operation mode.
Figure 4B:
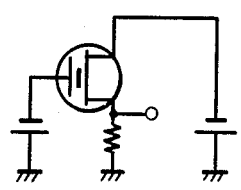
FIG. 4B shows a connection of the electrodes of the semiconductor memory device in the read operation mode.
Figure 4C:
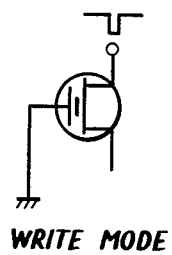
FIG. 4C shows a connection of the electrodes of the semiconductor memory device in the write operation mode.

FIG. 4A shows a connection of electrodes of the semiconductor memory device in the erase operation mode, FIG. 4B shows a connection of the electrodes of the semiconductor memory device in the read operation mode, and FIG. 4C shows a connection of electrodes of the semiconductor memory device in the write operation mode. More specifically, in the erased operation mode, the drain electrode is grounded and the erase voltage is applied to the control gate in the form of a negative going erase pulse, while the source electrode is opened. In the read operation mode, the source is grounded through a resistor, whereby a read output signal is obtained from the source electrode, while the control gate and the drain region are connected to the negative voltage source. In the write operation mode, the control gate is grounded and the drain region is supplied with a negative going write pulse, while the source electrode is opened.

Now referring to FIGS. 2, 3, 4A, 4B and 4C, a more detailed consideration will be given to the respective operation modes. In the erasing operation mode, an erase voltage Vg is applied to the control gate 7 with respect to the drain region 2. As a result, the floating gate 5 is charged to a value of the quantity of electric charge that brings about a threshold voltage Vt in accordance with the characteristic curve (b) of the FIG. 3 erase/write characteristic. In the write operation mode, if a write voltage Vd' is applied to the drain region 2, with respect to the control gate 7, the floating gate 5 is charged to a new value of the quantity of electric charge, whereby a new threshold voltage Vt' is attained in accordance with the write curve (a) of the FIG. 3 erase/write characteristic. If a new write voltage Vd" is applied to the drain region 2 with respect to the control gate 5, then the floating gate 5 is charged to a new value of the quantity of electric charge, whereby a new threshold voltage Vt" is attained. Referring to the FIG. 2 read characteristic, in the read operation mode, when a read gate voltage $V_G$ is applied to the control gate, a drain current Id' flows, if the semiconductor memory device has been subjected to a write voltage Vd' in the preceding write operation mode and another drain current Id" flows, if the semiconductor memory device has been subjected to a write voltage Vd" in the preceding write operation mode. In other words, the threshold voltage of the semiconductor memory device is changeable as a function of a write voltage value applied to the semiconductor memory device in the preceding write operation mode, and as a result, the drain current in the read operation mode is accordingly changeable as a functin of the threhold voltage and thus as a function of the write voltage applied to the semiconductor memory device in the preceding write operation mode. Thus, the semiconductor memory device as shown is capable of storing analog information.

A more detailed consideration will be given to the write operation mode. After the threshold voltage Vt' is attained by applying a write voltage Vd' to the semiconductor memory device, a new threshold voltage Vt" can be attained by applying a new write voltage Vd" to the semiconductor memory device. In other words, renewal of the threshold voltage can be readily achieved in the direction from the threshold voltage as erased toward the threshold voltage as not erased. On the other hand, the write operation in the opposite direction is difficult from the practical standpoint. Therefore, preferably it is adapted such that the write operation is effected in the direction from the threshold voltage as erased toward a threshold voltage as not erased.

Figure 5:
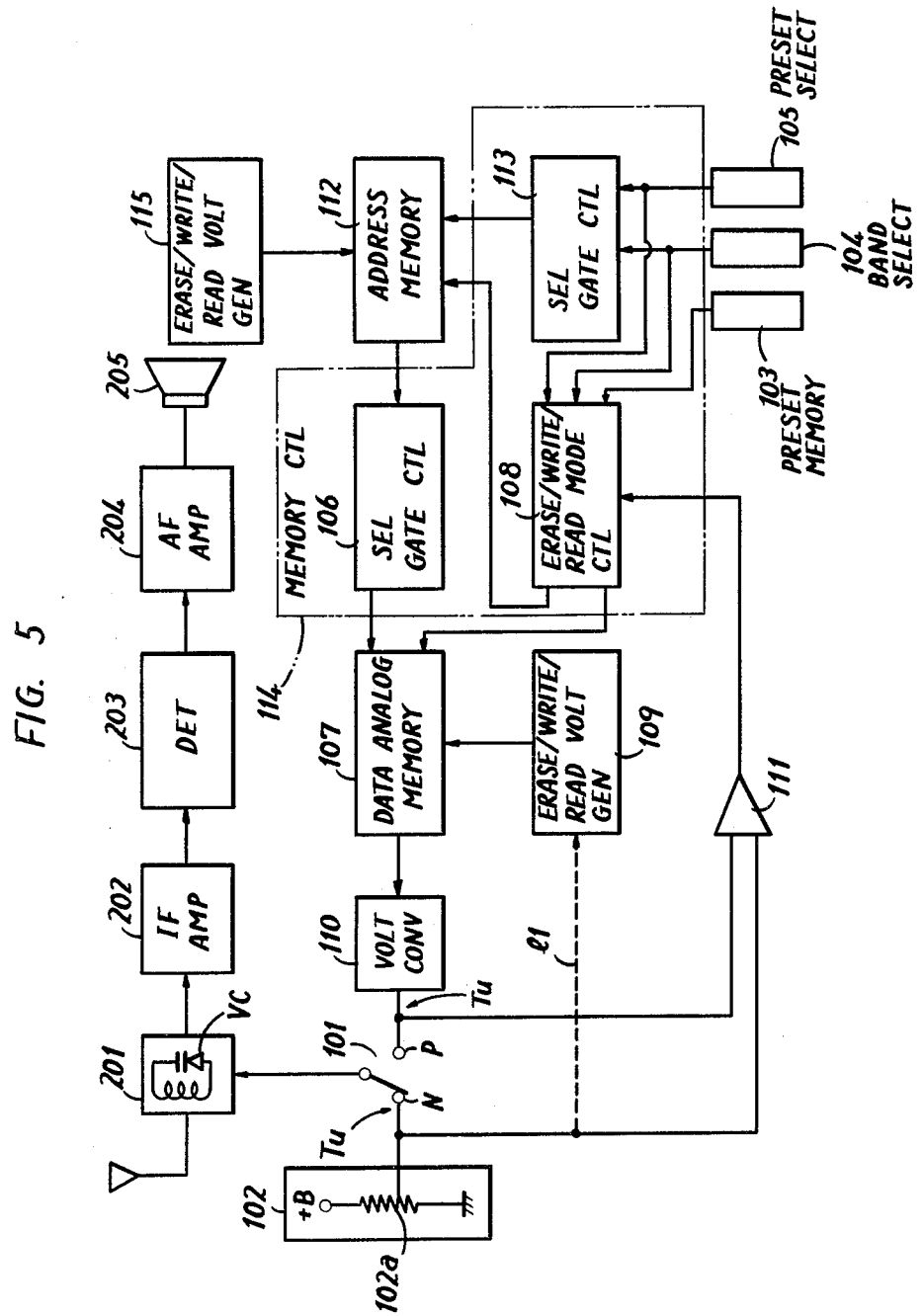
FIG. 5 shows a block diagram of a radio receiver employing a tuning apparatus having a tuning or tank circuit employing a voltage controlled variable capacitance diode which is supplied with a tuning voltage from a voltage source using the above described non-volatile semiconductor analog memory device.

FIG. 5 shows a block diagram of a radio receiver employing a tuning apparatus having a tuning or tank circuit employing a voltage controlled variable capacitance diode which is supplied with a tuning voltage from a voltage source using the above described nonvolatile semiconductor analog memory device. A major portion of a typical radio receiver is shown in the upper portion of the FIG. 5 diagram, which comprises a tuner 201 coupled from an antenna, an intermediate frequency amplifier 202, a detector 203 coupled to the intermediate frequency amplifier 202 for detecting the amplitude or the frequency of the intermediate frequency output and subsequent audio stages, such as an audio amplifier 204 and a speaker 205, which are well known and therefore not descried in detail. The tuner 201 usually comprises a high frequency amplifier, a local oscillator and a mixer. For the purpose of embodying the present invention, the tuner 201 of the radio receiver shown further comprises a voltage controlled variable reactance device VC, which is connected so as to constitute a part of a tuning circuit for the high frequency amplifier and the local oscillator. A typical and preferred voltage controlled variable reactance device of a solid state type now commercially available is a voltage controlled variable capacitor. As described in the foregoing, such a voltage controlled variable capacitor uses a capacitance formed at a barrier portion of a semiconductor diode, which is variable as a function of or in reverse proportion to a reverse voltage applied thereacross, and is also known as a variable capacitance diode. However, it should be understood that any type of a voltage controlled variable reactance device can be used for the purpose of the present invention, insofar as it is available. The tuner 201 is shown connected to receive a tuning voltage from the lower circuit portion in the FIG. 5 diagram which constitutes a major portion of the FIG. 5 embodiment.

The tuner 201 is connected to receive a tuning voltage through a switch 101. The contact N of the switch 101 is connected to a tuning votlage generator 102, which comprises a variable resistor 102a coupled between the voltage source +B and the ground. The contact P of the switch 101 is connected to the output of a voltage conversion circuit 110 and an input of a comparator 111, which are described more fully subsequently. Manual adjustment of the variable resistor 102a provides a variable voltage. The switch 101 is turned to the contact N in the normal selection mode and is turned to the contact P in the preset selection mode. When the switch 101 is turned to the contact N, a tuning voltage as adjusted by the variable resistor 102a is applied to the variable capacitance diode VC in the tuner 201, whereby the tuning circuit in the tuner 201 is tuned to a desired broadcasting frequency.

The intermediate frequency signal as obtained from the tuner 201 is amplified by the intermediate frequency amplifier 202 and is further detected by the detector 203. The detected output from the detector 203 is amplified by the audio amplifier 204 and then is applied to the speaker 205. Thus, the ordinary selection of channel is acheived.

In the foregoing, the tuning voltage generator 102 was described as comprising a variable resistor which is manually adjustable for the purpose of providing a variable tuning voltage to scan a given frequency band. Alternatively, the tuning voltage generator 102 may be structured to provide a well known sawtooth waveform tuning voltage for the purpose of achieving an automatic scanning operation. In such an automatic scanning type tuning apparatus, preferably the apparatus is structured such that an automatic scanning operation is discontinued responsive to a signal representing a tuning state by the tuner. Such automatic scanning apparatus is fully described in U.S. Pat. No. 3,965,288, entitled "Automatic Tuning Apparatus" and issued June 22, 1976; U.S. Pat. No. 3,967,057, entitled "Automatic Tuning Apparatus" and issued June 29, 1976; U.S. Pat. No. 3,986,154 entitled "Automatic Tuning Apparatus" and issued Oct. 12, 1976; and U.S. Pat. No. 4,008,437 entitled "Automatic Tuning Apparatus" and issued Feb. 15, 1977, all assigned to the same assignee as the present invention. The above referenced patents are incorporated herein by reference thereto. Preferably, the inventive tuning apparatus may employ both a manually operable tuning voltage generator such as described in conjunction with the tuning voltage generator 102 and an automatic tuning voltage generator adapted for generating an automatic scanning voltage, which are selectively connected to the tuner 201 by means of a suitable switch. It is intended that the present invention covers any of the above described modifications.

According to the present invention, the tuning voltage corresponding to the broadcasting frequency as received as a result of selection by manual adjustment of the variable resistor 102a of the tuning voltage generator 102 can be stored in a non-volatile semiconductor analog memory device including a floating gate type field effect semiconductor memory device. Briefly described, according to the embodiment shown, manual operation of a band selection switch 104 and a preset selection switch 105 controls a selection gate control 106 of a memory control circuit 114, whereby a data analog memory 107 comprising a floating gate type field effect semiconductor memory device is properly addressed responsive to the output of the selection gate control 106. Manual operation of a preset memory switch 103 controls an erase/write/read mode control 108 of the memory control circuit 114 and a write voltage is obtained from erase/write/read voltage generator 109 and is applied to the semiconductor memory device in the data memory 107, as addressed, whereby the write voltage is written in the semiconductor memory device the data memory 107 in the form of a threshold voltage as described previously. The write voltage as written in the data memory 107 is immediately read out in the form of a drain current, as described previously, and is further converted into a corresponding tuning voltage by the above described voltage conversion circuit 110, whereupon the converted tuning voltage from the voltage conversion circuit 110 is compared with the tuning voltage obtained from the tuning voltage generator 102. Since the data memory 107 does not store any information in the form of a tuning voltage version but rather in a threshold voltage version, as described previously, the output of the data memory 107 need be amplified suitably by means of the voltage conversion circuit 110, which may comprise typically an amplifier. The converted output tuning voltage from the voltage conversion circuit 110 is adapted to be compared with the tuning voltage obtainable from the tuning voltage generator 102 by means of a comparator 111. Each of the above described write and read operations is effected for a relatively short time period and is alternately repeated until the converted tuning votlage from the voltage conversion circuit 110 comes to coincide with the tuning votlage obtainable from the tuning voltage generator 102. When the coincidence of both tuning voltages is achieved, a disabling signal is obtained from the above described comparator 111 and is applied to the erase/write/read mode control 108 to terminate the write operation of the data memory 107. This means that the information corresponding to the tuning voltage as attained by the tuning voltage generator 102 is written into the data memory 107.

After the data corresponding to the desired tuning voltage is written into the data memory 107, preset selection of the channel corresponding to the above described tuning voltage can be effected by simply turning the switch 101 to the contact P of the switch 101 and by operating the band selection switch 104 and the preset selection switch 105. The data memory 107 is addressed responsive to the outputs of these switches 104 and 105 and the output as read out from the data memory 107, as addressed, is amplified by the voltage conversion circuit 110. The output from the voltage conversion circuit 110 is applied, as a preset tuning voltage, to the tuner 201, whereby the broadcasting frequency of the desired broadcasting station is selected by way of preset selection.

Meanwhile, it is desired that after the broadcasting frequency of a desired broadcasting station is selected by way of preset selection and a power supply to the radio receiver is turned off the same reception state as established before the power supply to the radio receiver is turned off is again established when the power supply is turned on again. In order to realize such situation, a non-volatile address memory may be provided to store the data concerning the previous operation of the band selection switch 104 and the preset selection switch 105, i.e. the data concerning how these switches 104 and 105 were operated previously. To that end, the FIG. 5 embodiment further comprises an address memory 112 for storing the address of the data memory 107 selected by the operation of the band selection switch 104 and the preset selection switch 105 and the above described selection gate control 106 of the memory control circuit 114 is structured to be controllable responsive to the output as read out from the address memory 112. More specifically, storage of the above described address as selected by the operation of the switches 104 and 105 is achieved by the selection gate control 113 of the memory control circuit 114 for controlling the non-volatile address memory 112 and the erase/write/read voltage generator 115 for supplying the erase/write/read voltage to the address memory 112. With such structure, when the power supply is turned on again, the above described selection gate control 106 is controlled responsive to the output as read out from the address memory 112, whereupon the same address as previously established to the data memory 107 is regained.

Since in the foregoing an outline of the circuit configuration and operation of the FIG. 5 embodiment was described, the opration of the FIG. 5 embodiment will be described in the following by itemizing the operation to "Writing of Selected Address in Address Memory", "Writing of Tuning Voltage in Data Memory" and "Preset Selection". It is pointed out that for simplicity of explanation of the embodiment shown the invention will be described as embodied in a preset radio receiver of 2-band(AM and FM) and with the number of preset channel selection being 2.

Writing of Selected Address in Address Memory

The address as determinable by the operation of the band selection switch 104 and the preset selection switch 105 is stored in the non-volatile analog memory 112 as structured in the manner described previously. Since the address per se is of a digital nature, the address memory may be implemented by a non-volatile digital memory.

Figure 6:
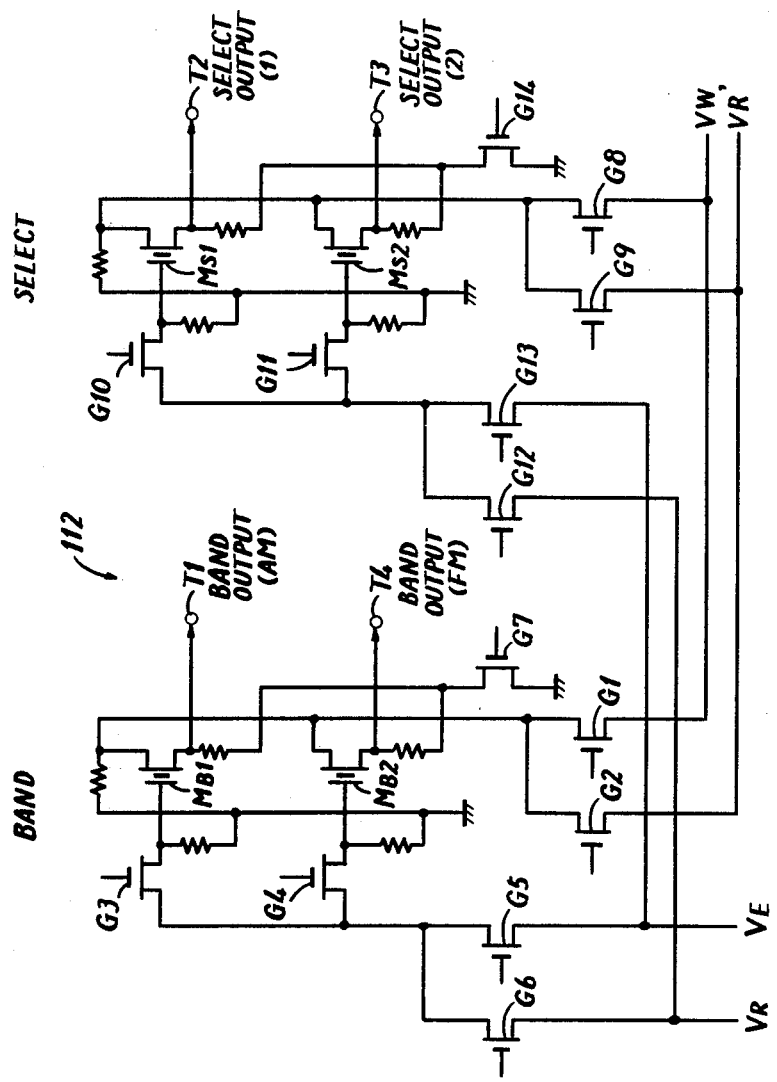
FIG. 6 shows a schematic diagram of the address memory.

FIG. 6 shows a schematic diagram of the address memory 112. In order to store the data concerning the band addresses, address semiconductor memory devices MB1 and MB2 are provided. On the other hand, in order to store the data concerning the selection addresses, address semiconductor memory devices MS1 and MS2 are provided. Switching gates G1 to G7 implemented by field effect transistors are provided for selectively achieving the erase/write/read operation of the address semiconductor memory devices MB1 and MB2 and similarly the switching gates G8 to G14 implemented by field effect transistors are provided for selectively achieving the erase/write/read operation of the address semiconductor memory devices MS1 and MS2. Since the write operation of the band addresses and the write operation of the selection addresses are effected in exactly the same manner, in the following only the write operation of the band addresses will be described while the description of the write opertion of the selection addresses will be omitted. The switching gates G1 and G2 serves to selectively provide a write voltage VW or a read voltage VR' supplied from the erase/write/read voltage generator 115 to the drains of the memories MB1 and MB2, thereby to establish a write mode or a read mode of the memory devices MB1 and MB2. The switching gates G3 and G4 are both opened in the erase mode and the read mode but only either is closed selectively in the write mode, thereby to establish a write mode to either of the memory devices MB1 and MB2. The switching gates G5 and G6 serve to selectively feed the erase voltage VE or the read voltage VR supplied from the erase/write/read voltage generator 115 to the control gates of the memory devices MB1 and MB2, thereby to establish an erase mode or a read mode to the memory devices MB1 and MB2. The switching gate G7 is opened in the read mode, thereby to connect the source electrodes of the memory devices MB1 and MB2 to the ground, when the band address output is obtained from across a source resistor. It is pointed out that the above described voltages VE, VW, VR and VR' supplied from the erase/write/read voltage generator 115 are each a constant voltage and accordingly the voltage generator 115 is structured to generate such voltages.

Figure 7:
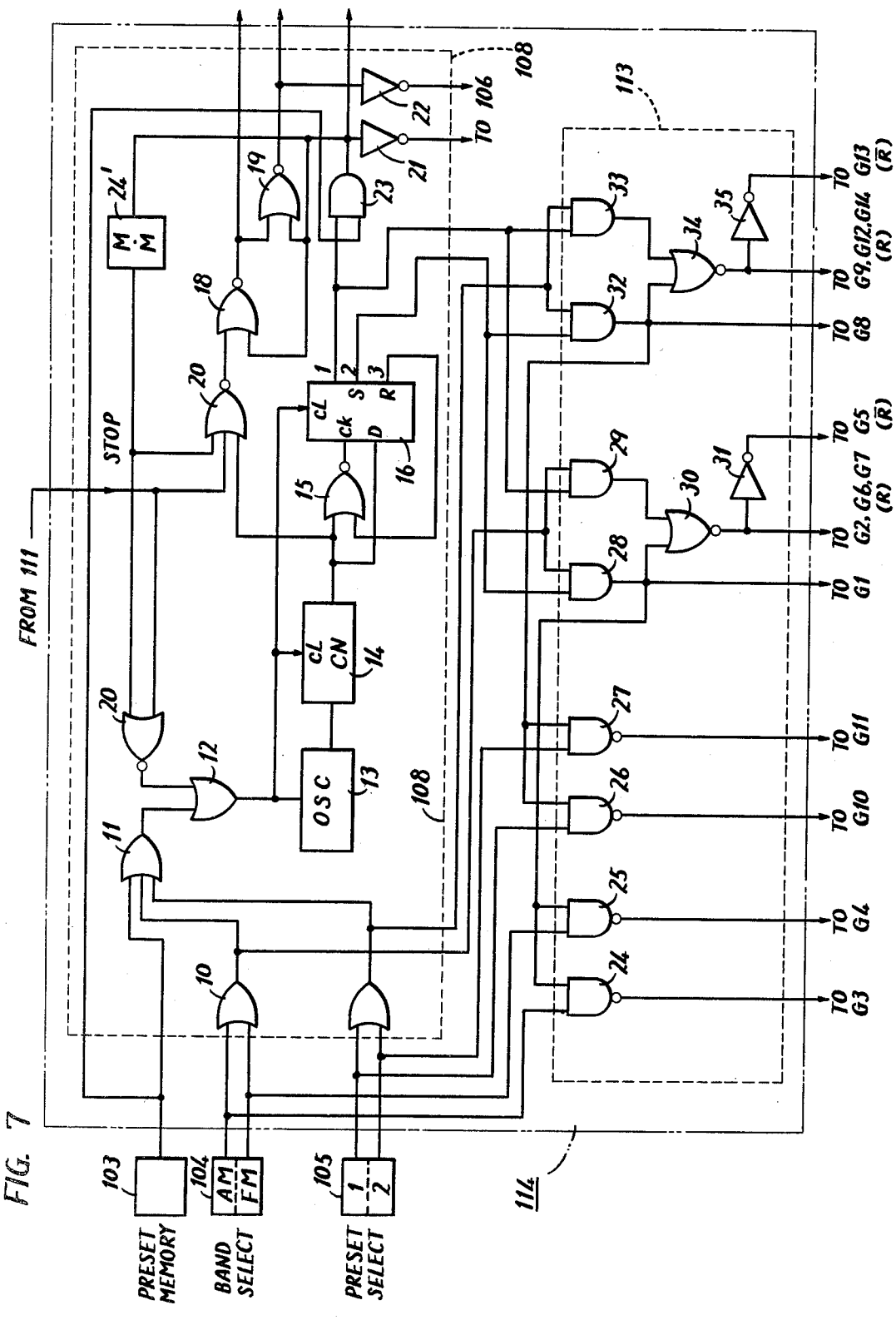
FIG. 7 shows a schematic diagram of the erase/write/read mode control and the selection gate control for the address memory.

FIG. 7 shows a schematic diagram of the erase/write/read mode control 108 and the selection gate control 113 included in the memory control circuit 114. Referring to FIG. 7, description will be made of how the band address is stored in the memory device MB1 when the band selection switch 104 is operated to select the AM band, for example. When the band selection switch 104 is operated, OR gates 10, 11, and 12 are enabled and the high level output from the OR gate 12 is applied to a counter 14 and a serial-in-parallel-out type shift register 16, whereby the counter 14 and the shift register 16 are cleared, and an oscillator 13 is enabled. The pulses obtained from the oscillator 13 are properly frequency divided by the counter 14 and the output from the counter 14 is applied to the data terminal D of the shift register 16. The shift register 16 provides the pulse outputs sequentially from terminals 1, 2 and 3, but when the pulse output is obtained from the terminal 3, the output of a NOR gate 15 becomes the low level and the clock terminal CK of the shift register 16 is not supplied with the clock input any more, with the result that the operation of the shift register 16 is discontinued.

When the pulse output is obtained from the terminal 1 of the shift register 16 for the first time, two inputs of an AND gate 29 both become the high level, whereby the output of a NOR gate 30 turns from the high level to the low level, while the output of an inverter 31 turns from the low level to the high level. The switching gate G5 of the address memory 112 is opened responsive to the high level output of the inverter 31. On the other hand, one input of an AND gate 28 is the low level and the outputs of NAND gates 24 and 25 are both the high level. The switching gates G3 and G4 are both responsive to the high level output of the NAND gates 24 and 25 to be opened. Accordingly, the erase voltage VE from the voltage generator 115 is applied through the switching gates G3, G4 and G5 to the gate electrodes of the memory devices MB1 and MB2, whereby any information concerning the band address as stored in the memory devices MB1 and MB2 is erased. Thus, when the pulse is obtained from the terminal 1 of the shift register 16, the switching gates G3, G4 and G5 of the address memory 112 are enabled, whereby the address memory devices MB1 and MB2 are placed in the erase mode.

When the pulse output is then obtained from the terminal 2 of the shift register 16, the AND gate 28 is enabled and the output therefrom becomes the high level. Two inputs of the NAND gate 24 both become the high level, whereby the output therefrom becomes the low level. The NAND gate 25, the NOR gate 30 and the inverter 31 remain the same as in the erase mode. Accordingly, the outputs of the NAND gate 25, the AND gate 28 and the inverter 31 become the high level and accordingly the switching gates G1, G4 and G5 of the address memory 112 are enabled. Therefore, the write voltage VW obtainable from the erase/write/read voltage generator 115 is applied to the drains of both the memory devices MB1 and MB2; however, the control gate of the memory device MB1 is grounded through a gate resistor since the switching gate G3 is closed, while the control gate of the memory device MB2 is supplied with the erase voltage VE from the voltage generator 115 through the switching gates G5 and G4, with the result that the data is written in only the memory device MB1. When the band selection switch 104 is operated to select the FM band, the switching gates G1, G3 and G5 are enabled, whereby the data is written in the memory device MB2. Thus, when the pulse output is obtained from the terminal 2 of the shift register 16, either memory device MB1 or MB2 of the address memory 112 is placed in the write mode.

When the pulse output is thereafter obtained from the terminal 3 of the shift register 16, the operation of the shift register 16 is terminated; however, in such a normal state, the switching gates G2, G3, G4, G6 and G7 of the address memory 112 have been enabled responsive to the high level outputs of the NAND gates 24 and 25 and the NOR gate 30. Accordingly, the read voltage VR' is applied through the switching gate G2 to the drains of the memory devices MB1 and MB2 and the read voltage VR is applied through the switching gates G3, G4 and G6 to the control gates of the memory devices MB1 and MB2, while the sources of the memory devices MB1 and MB2 are grounded through the switching gate G7, with the result that both the memory devices MB1 and MB2 are placed in the read mode, so that the information as stored in either memory device concerning the band address is read out.

The write operation of the selection addresses is also effected in a similar manner. More specifically, when the preset selection switch 105 is operated, the NAND gates 26 and 27, the AND gates 32 and 33, the NOR gate 34, the inverter 35 and the switching gates G8 to 14 are properly selected and controlled, whereby the information concerning the selection addresses is written in either memory device MS1 or MS2.

Since the above described erase and write operation to the memory devices is effected instaneously, the switches 104 and 105 may be even a touch switch, in which case even a short time period of a finger contact to the touch switch is sufficient enough to allow the above described instantaneous erase and write operation.

Writing of Tuning Voltage to Data Memory

As described previously, the data concerning the band addresses and selection addresses is written in the address memory 112 responsive to the operation of the band selection switch 104 and the preset selection switch 105, whereupon a continuous read operation mode is established and the band addressing output and the selection addressing output are obtained from the address memory 112. Now description will be made of how the data concerning a tuning voltage obtained from the tuning voltage generator 102 is written into the memory device of the data memory 107 as addressed responsive to the above described band addressing output and the selection addressing output.

Figure 8:
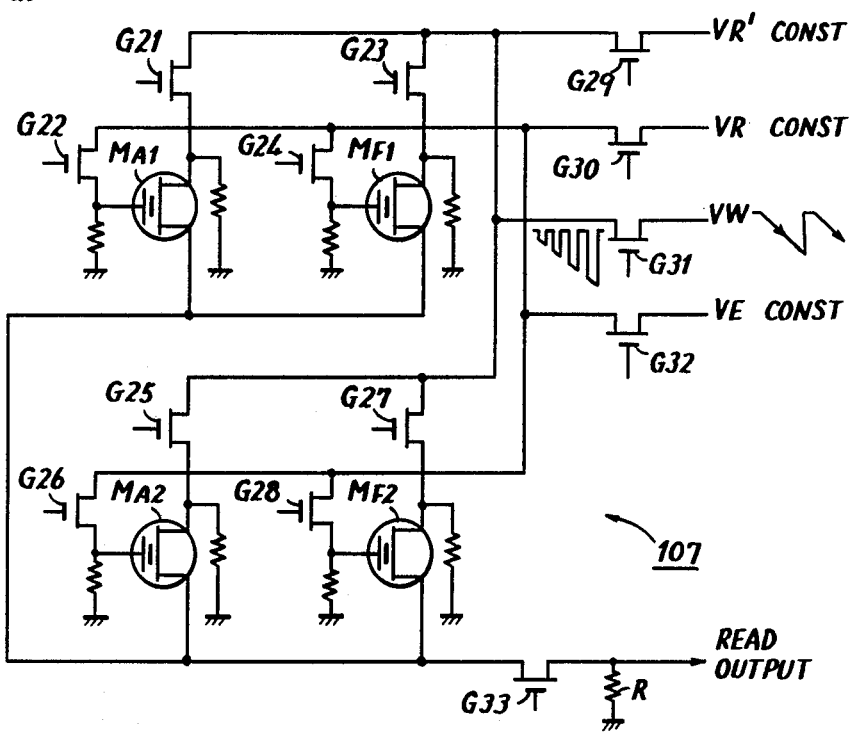
FIG. 8 shows a schematic diagram of the data memory.
Figure 9:
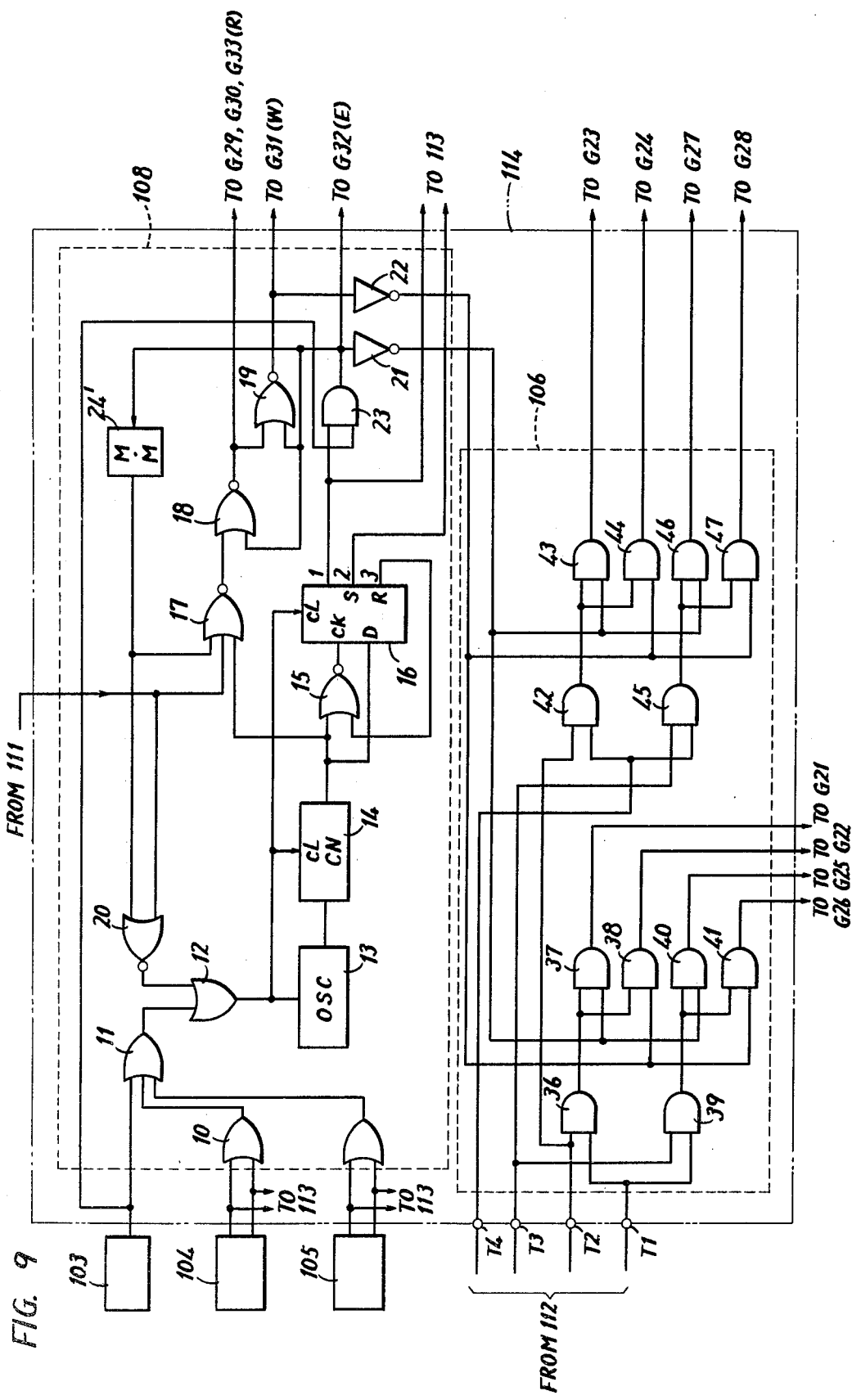
FIG. 9 shows a schematic diagram of the erase/write/read operation mode control and the selection gate control for the data memory.

According to the present invention, the data concerning a tuning voltage is stored in the non-volatile data analog memory 107 structured in the manner described previously. FIG. 8 shows a schematic diagram of the data memory 107. For the purpose of simplifying the structure of the switching gates to be provided around the memory devices of the data memory 107, the data memory devices MA1 and MA2 and MF1 and MF2 are arranged in a matrix fashion, wherein the row arrangement of the memory devices is allotted to the frequency bands and the column arrangement of the memory devices is allotted to the preset channels or frequencies. The switching gates G21 to G28 of the data memory 107 are controlled in association with the addressing operation. FIG. 9 shows a schematic diagram of the selection gate control 106 of the memory control circuit 114 for controlling the switching gates G21 to G28, wherein the addressing outputs obtained from the above described address memory 112 are applied to the terminals T1 to T4 to achieve the erase/write/read operation to only the data memory device as addressed.

In case of an embodiment wherein the address memory 112 is not provided, the outputs of the band selection switch 104 and the preset selection switch 105 are directly applied to the terminals T1 to T4. In case of an embodiment wherein the address memory 112 is not provided and touch switches are employed as the band selection switch 104 and the preset selection switch 105, it would be necessary to provide the latch circuits for continually providing the addressing outputs responsive to the operation of the touch switches so that an instantaneous output of the touch switch is maintained.

Figure 10:
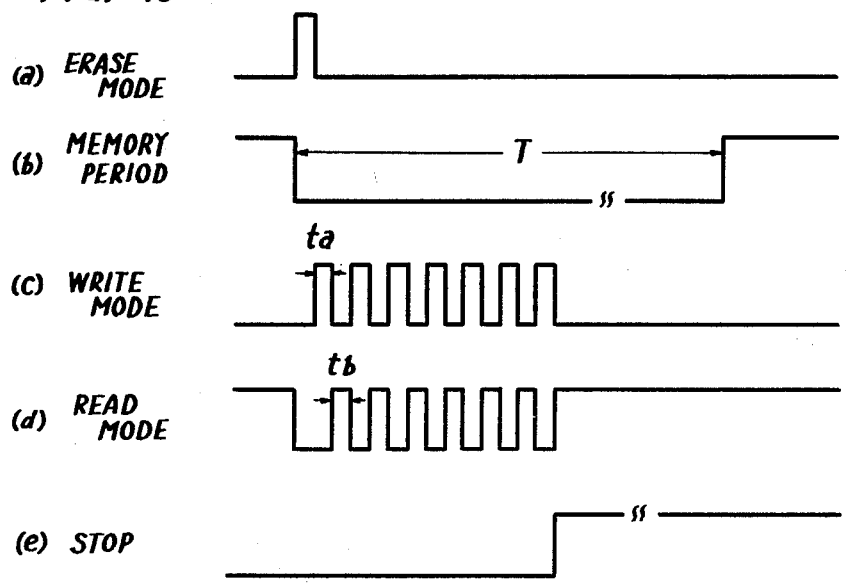
FIG. 10 shows a waveform illustrating the timing relation of the respective operation modes.

The switching gates G29 to G33 are controlled in association with the erase, write and read operation modes. FIG. 9 also shows a schematic diagram of the erase/write/read operation mode control 108 for controlling the switching gates G29 to G33. FIG. 10 shows a waveform illustrating the timing relation of the respective operation modes.

The read voltage VR' of a constant value is applied through the switching gate G29 to the data memory 107, the read voltage VR of a constant value is applied through the switching gate G30 to the data memory 107, the write voltage VW of a sawtooth waveform is applied through the switching gate G31 to the data memory 107, and the erase voltage VE of a constant value is applied through the switching gate G32 to the data memory 107. These voltages are generated by the erase/write/read voltage generator 109.

Now description will be made of how the data concerning a tuning voltage is written in the memory device MA1 in case where the addressing outputs are applied to the terminals T1 and T2 and the preset memory switch 103 is operated. When the preset memory switch 103 implemented by a touch switch is operated, the oscillator 13, the counter 14 and the shift register 16 are enabled, as done when the switches 104 and 105 are operated. When the pulse output is obtained for the first time from the terminal 1 of the shift register 16, both inputs of the AND gate 23 become the high level and the output of the AND gate 23 becomes the high level. Accordingly, the switching gate G32 of the data memory 107 is enabled responsive to the high level output from the AND gate 23. On the other hand, out of the inverters 21 and 22 the outputs of which are normally the high level, only the inverter 21 comes to provide the low level because of inversion of the high level output from the AND gate 23, which makes the output of the AND gate 38 be the high level, whereby the switching gate G22 of the data memory 107 is enabled. Accordingly, the erase voltage VE obtained from the erase/write/read voltage generator 109 is applied through the switching gates G22 and G32 only to the memory device MA1, whereby any information as stored previously is erased to be ready for storage of new data. In other words, when the pulse output is obtained from the terminal 1 of the shift register 16, the erase operation mode is established. See FIG. 10(a).

A monostable multivibrator 24' is triggered responsive to the high level output of te AND gate 23, whereby the output of the monostable multivibrator 24' is reversed from the high level to the low level during the quasi-stable period T, thereby to allow for a write operation to the memory device as addressed during the above described quasi-stable period T. See FIG. 10(b). More specifically, as different from the writing operation of the data concerning the addresses of a digital nature, the writing operation of the analog data concerning a tuning voltage cannot be achieved instantaneously. Therefore, in the embodiment shown, the write operation of the analog data is repetitively effected through a continuous operation of the oscillator 13 responsive to the enabled output of the NOR gate 20. The stop signal is normally the low level but the stop signal becomes the high level whenever the data concerning a desired tuning voltage is written in the memory device as addressed, whereupon the operation of the oscillator 13 is terminated to discontinue any further writing operation. The stop signal will be described in more detail subsequently.

After the output of the terminal 1 of the shift register turns to the low level, the outputs of the NOR gates 18 and 19 alternately become the high level responsive to the output of the counter 14, whereby the write operation mode and the read operation mode are alternately and repetitively effected. The high level output of the NOR gate 19 represents the write operation mode (see FIG. 10(c)), while the high level output of the NOR gate 18 represents the read operation mode (see FIG. 10(d)). When the stop signal becomes the high level (FIG. 10(e)), the output of the NOR gate 17 becomes and remains the low level, while the output of the NOR gate 18 becomes and remains the high level. Accordingly, a continual read operation mode is thereafter established. As described previously, after the output of the terminal 3 of the shift register 16 becomes the high level, the operation is terminated, which ensures that the output of the terminal 1 becomes again the high level. More specifically, the erase operation mode is established only one time immediately after the operation of the preset memory switch 103.

In the write operation mode, the outputs of the NOR gate 19 and the AND gate 37 become the high level, whereby the switching gates G21 and 31 of the memory device 107 are enabled. As a result, the write voltage VW obtained from the erase/write/read voltage generator 109 is applied through these switching gates G21 and G31 to only the drain of the memory device MA1, whereby the write operation is effected only for the memory device MA1.

In the read operation mode, the outputs of the NOR gate 18 and the AND gates 37 and 38 becomes the high level and the switching gates G21, G22, G29, G30 and G33 of the data memory 107 are enabled. As a result, the read voltage VR obtained from the erase/write/read voltage generator 109 is applied through the switching gates G22 and G30 to the control gate of the memory device MA1 and the read voltage VR' obtained from the erase/write/read voltage generator 109 is supplied through the switching gates G29 and G21 to the drain of the memory device MA1, with the result that a read output is obtained across a resistor R connected between the source of the memory device MA1 and the ground in terms of the drain current. Since the drain current of the memory device MA1 is variable as a function of the write voltage, the read output is different depending upon the write voltage.

The read output as withdrawn from the memory device MA1 is inverted and amplified by the voltage conversion circuit 110 shown in FIG. 5 and the voltage converted output in the form of a tuning voltage obtained from the voltage conversion circuit 110 is compared with the tuning voltage generated by the tuning voltage generator 102. The write operation mode and the read operation mode are alternately and repetitively effected until the converted output in the form of a tuning voltage obtained from the voltage conversion circuit 110 comes to coincide with the tuning voltage generated by the tuning voltage generator 102. Upon coincidence of the converted output from the voltage conversion circuit 110 and the tuning voltage generated by the tuning voltage generator 102, a stop signal is obtained from the comparator 111, whereupon the read operation mode is thereafter continually established, thereby to prevent a further write operation. See FIG. 10(e).

Thus, the analog value corresponding to the tuning voltage generated by the tuning voltage generator 102 is written in the memory device MA1. Similarly, different analog values corresponding to other different tuning voltages can be written in the remaining memory devices MA2, MF1 and MF2 through proper selective control of the AND gates 39 to 47 and the switching gates G23 to G28 of the data memory 107.

Now the write voltage to be applied to the data memory 107 will be described with reference to FIG. 11. Referring to FIG. 11, the waveform (a) shows the output of the NOR gate 20, wherein the reference character T denotes a quasi-stable period of the monostable multivibrator 24' in which time period the writing operation is allowed. The waveform shows a case where on the occasion of the first operation of the preset memory switch 103 at the timing t0 no stop signal is generated during the time period T, whereby the write operation is effected to the data memory by the maximum write voltage and on the occasion of the second operation of the preset memory switch 103 at the timing t1 the stop signal is generated at the timing t2, whereby the write operation is effected by the write voltage obtainable at the timing t2. The waveform (b) shows a sawtooth wave write voltage generated by the erase/write/read voltage generator 109. The sawtooth wave is generated such that the scanning is initiated responsive to the operation of the preset memory switch 103 and the scanning is terminated responsive to the termination of the operation of the monostable multivibrator 24' or the stop signal. The waveform (c) shows the write voltage as chopped responsive to the write operation mode output (see FIG. 10(c)) applied to the switching gate G31 of the data memory 107 and actually applied to the data memory 107. Now description will be made of the relation of the width of the write/read pulses and the scanning time period T of the sawtooth wave. The write pulse width ta and the read pulse width tb are determined by the write/read speed characteristic of the memory device and a tuning frequency deviation Δv allowed to a tuner. More specifically, too small a width ta+tb causes a fear of insufficient write/read operation, while too large a width (ta+tb) causes an increased difference between the write voltage values of the write pulse n and the following write pulse n+1, with the result of a degraded tuning precision. Generally, the tuning frequency deviation Δv need be 4 mV and the width ta+tb need be 2 msec. Now assuming that the tuning voltage is varied from the voltage V1 to the voltage V2, then the following equation is obtained.

$$V2 - V1 = \frac{T}{ta + tb} \cdot \Delta V$$

Therefore, the scannng time period T may be expressed by the following equation.

$$T = \frac{V2 - V1}{\Delta V} \cdot (ta = tb)$$

The voltage difference V2−V1 is different depending on the broadcasting band. Assuming that V2−V1=8V, then the scanning time period T becomes T=4 sec. This means that it requires four seconds at the most in order to preset the data concerning the tuning voltage to a memory device and such a time period is not preferred from the practical standpoint. In order to eliminate such shortcoming, the relation between the tuning voltage and the write voltage is in advance evaluated and, when it is desired that the data concerning a tuning voltage corresponding to the write voltage VM·m in the memory device, the write operation is preferably initiated starting from the write voltage such as VW·m' which is slightly lower than the write voltage VW·n. If the apparatus is structured to effect the scanning operation as depicted in FIG. 11(d), then the write time period can be shortened from the period t' to t.

FIG. 12 shows a schematic diagram of a preferred embodiment of such sawtooth wave write voltage generator 109. Referring to FIG. 12, an operational amplifier 51 is connected to receive, at one input thereof, through a line 11 the tuning voltage Tu·n generated by the tuning voltage generator 102. Such line 11 is shown in FIG. 5 embodiment by a dotted line 11. The operational amplifier 51 is structured such that the same is responsive to a given tuning voltage Tu·n to provide a write voltage Vw·n' which is slightly lower than the write voltage VW·n corresponding to the applied tuning voltage Tu·n. The switching gate G0 is enabled reponsive to the high level output of the NOR gate 20. Assuming that the switching gate G0 is disabled, then the potentials at both points A and B are VW·n'. If the preset memory switch 103 is operated in such a situation, the output of the NOR gate 20 becomes the high level and the switching gate G0 is enabled. Then a capacitor C starts being discharged, whereby the potential at the point A changes from the potential VW·n' to the potential as potential divided by resistors R1 and R2 of the potential difference V−VW·n'. Thus, the write voltage VW as shown in FIG. 11(d) is obtained from the point A. Such write voltage enables a prompt write operation following the operation of the preset memory switch 103.

Preset Selection

After the data concerning a desired tuning voltage is preset to the data memory 107, reception of a broadcasting frequency or channel can be made by preset selection. More specifically, the preset selection can be achieved by turning the switch 101 to the contact P and by operating the band selection switch 104 and the preset selection switch 105, as desired.

Assuming that the AM band is selected by the band selection switch 104, for example, the address memory devices MB1 and MB2 are placed in the erased operation mode and then placed in the write operation mode, whereupon the data representative of the AM band is written in the memory device MB1. Thereafter the read operation mode is continually established and the band addressing output representative of the AM band is obtained from the memory device MB1. Similarly, assuming that the first station is selected by the preset selection switch 105, the selection addressing output representative of the first station is obtained from the memory device MS1. The data memory 107 is addressed responsive to the above described two addressing outputs and the relevant memory device is addressed.

On the other hand, the data memory 107 is continually placed in the read operation mode unless the preset memory switch 103 is newly operated or in the normal operation state, as readily understood from the foregoing description. Therefore, the data is read out from the memory device MA1 of the data memory 107 as addressed responsive to the addressing outputs from the address memory 112 and the data as read out from the memory device MA1 is amplified by the voltage conversion circuit 110. The amplified output from the voltage conversion circuit 110 in the form of a tuning voltage is applied to the tuner 201 through the switch 101. Thus, reception by the prset selection is achieved.

Now consider a case where after once a receiving state is established by the preset selection the powder supply of the receiver is once turned off and thereafter the power supply is turned on. As described previously, the address memory 112 is normally placed in the read operation mode.

Accordingly, the same addressing outputs as before are obtained from the address memory 112 in such a situation. Thus, the same broadcasting channel or frequency as before can be received even in such a situation.

Figure 13:
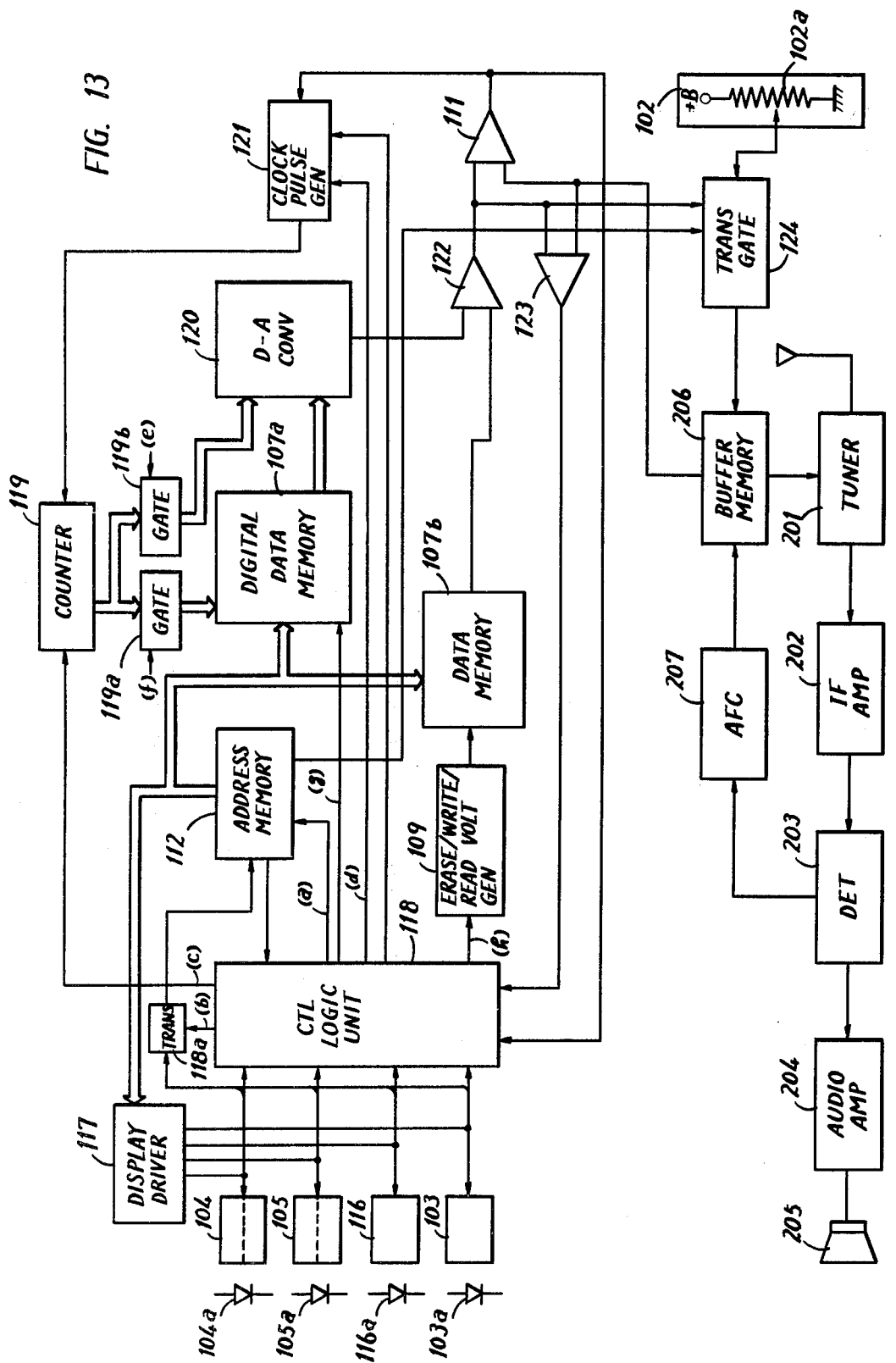
FIG. 13 shows a block diagram of a radio receiver employing another embodiment of the preset tuning apparatus in accordance with the present invention.

FIG. 13 shows a block diagram of a radio receiver employing another embodiment of the preset tuning apparatus in accordance with the present invention. A characteristic feature of the embodiment shown resides in a division of the tuning voltage into a rough tuning voltage and a fine tuning voltage and separate storage of the rough tuning voltage in a digital data memory and the rough tuning voltage in an analog data memory. The embodiment shown comprises a further characteristic feature that the tuning voltage as stored in the data memroy on the occasion of preset selection is once transferred or written in a buffer memory, wherein the tuning voltage as written is corrected responsive to automatic frequency control signal which corrected voltage is utilized as an actual tuning voltage in the tuner. In this connection, the embodiment shown is structured such that if and when the tuning voltage as stored in the data memory is deviated by a value exceeding a predetermined value with respect to the actual tuning voltage corrected responsive to the automatic frequency control the data loaded in the data memory is renewed to a new tuning voltage through the re-write operation. To that end, the embodiment shown employs a control logic unit 118 in place of the memory control circuit 114 described in conjunction with the FIG. 5 embodiment.

Figure 14:
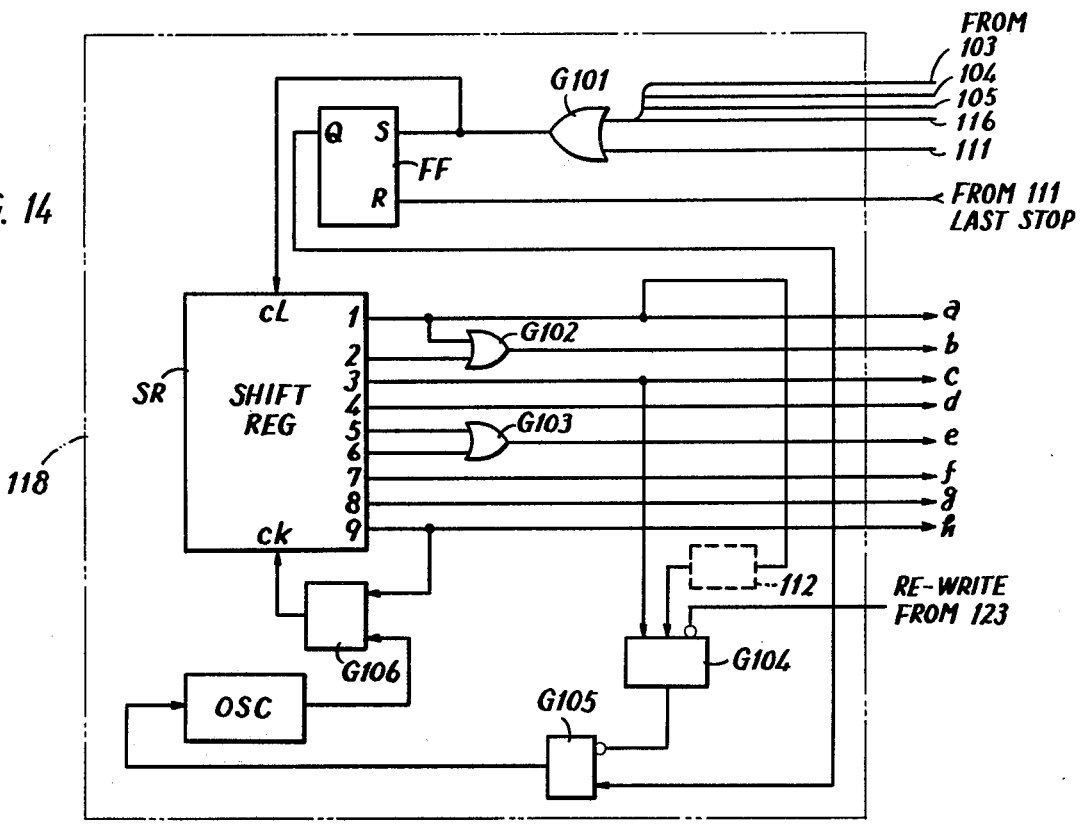
FIG. 14 shows in detail the major portion of the control logic unit.
Figure 15:
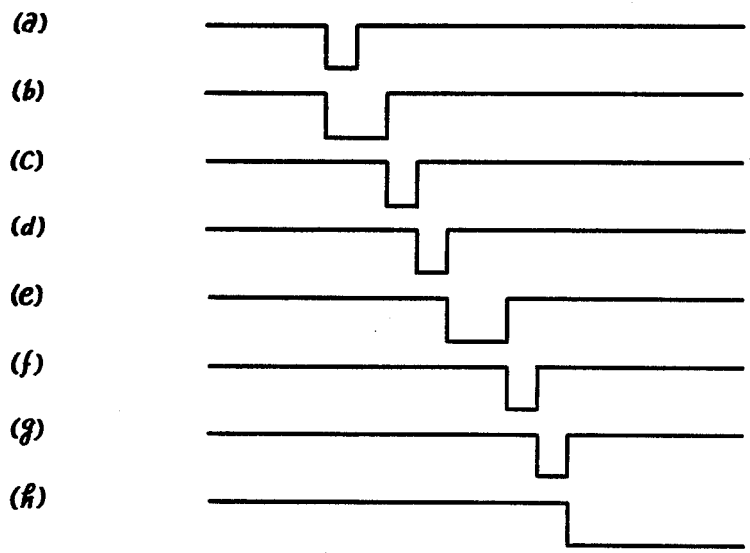
FIG. 15 shows the timing relation of various controls by the FIG. 14 control logic unit.

FIG. 14 shows in more detail the major portion of the control logic unit 118. FIG. 15 shows the timing relation of various controls by the FIG. 14 control logic unit 118. Referring to FIGS. 14 and 15, the control logic unit 118 will be first described in detail prior to detailed description of FIG. 13 embodiment.

The control logic unit 118 is structured to receive the signals obtained from various switches 103, 104, 105 and 116 shown in FIG. 13. The control logic unit 118 is further structured to receive a re-write command signal obtainable from a subtractor 123 and a last stop signal obtainable from the comparator 111. The operation signals from various switches and the re-write command signal from the subtractor 123 are applied to the set input, for example, of the flip-flop FF through an OR gate G101 and is also applied to a clear input C of a nine-bit shift register SR, for example. The re-write command signal from the subtractor 123 is further applied to the gate 104. The last stop signal obtainable from the comparator 111 is applied as a reset input of the flip-flop FF so as to serve as the operation stop signal of the control logic unit 118.

If and when any one of the respective switches 103, 104, 105 and 116 shown in FIG. 13 is operated or the re-write command signal is inputted from the subtractor 123, the flip-flop FF is set and the shift register SR is cleared. When the flip-flop FF is set, the non-inverted output is applied to an oscillator OSC through a gate G105. Accordingly, the oscillator OSC starts the operation, thereby to generate a clock pulse having the width of 4 msec, for example. The clock pulse from the oscillator OSC is applied to the clock input terminal CK of the shift register SR through the gate 106. The shift register SR is responsive to the clock pulse fed through the gate G106, thereby to make a sequential shifting or stepping operation from one to nine.

The shift register SR is responsive to the first clock pulse after the same is cleared, thereby to provide the output from the terminal 1 of the shift register SR. The output signal a is shown in FIG. 15(a) and serves as a write timing signal for the address memory 112. If and when the second clock signal is applied to the shift register SR, then the following output is obtained from the terminal 2. The outputs from the terminals 1 and 2 are OR'ed by the OR gate G102 and the output from the OR gate 102 is withdrawn as a signal b. Accordingly, the signal b has the width of say 8 msec covering two clock pulses. The signal b defines the timing of the data transfer from a data transfer circuit 118a to the address memory 112. The purpose of selecting the pulse width of the signal b to cover two clock pulses, for example, is to ensure a time period for the data transfer for relatively a long predetermined time period irrespective of the length of the time period in which the switch 103, 104, 105 and 116 is actually operated.

If and when the third clock is obtained, the signal c is obtained from the terminal 3 of the shift register SR. The signal c serves to define the reset timing of the counter 119. If and when the fourth clock is inputted, the signal d is obtained from the terminal 4 of the shift register SR. The signal d serves to define the timing for enabling the clock pulse generator 121. The shift register SR is responsive to the fifth clock pulse to provide an output from the terminal 5 and further is responsive to sixth clock pulse to provide an output from the terminal 6, respectively. The outputs from the terminals 5 and 6 are OR'ed by the OR gate G103 and the output of the OR gate G103 is withdrawn as a signal e. The signal e serves to define the timing of data transfer from the counter 119 to a digital-analog converter 120. The signal e also has the clock width covering two clock pulses, as sinilar to the above described signal b. The pulse width of the signal e was selected to cover two clock pulses, in consideration of the fact that the counter 119 and the digital-analog converter 120 are both structured to be a five-bit, for example, which causes the time period required for one cycle of the counter 119 to exceed one clock pulse width.

If and when the seventh clock is supplied, a signal f is obtained from the output terminal 7 of the shift register SR. The signal f serves to define the timing of transfer of the output from the coutner 119 to the digital data memory 107a.

If and when the eighth clock is applied, a signal g is obtained from the terminal 8 of the shift register SR. The signal g serves to define the timing of the write operation to the digital data memory 107a. If and when the ninth clock is applied, a signal h is obtained from the terminal 9 of the shift register SR. The signal h serves to define the timing of the write operation of the data to the analog data memory 107d. If and when the signal h is obtained, the clock from the oscillator OSC is stopped from being applied to the shift register SR by means of the gate G106.

The embodiment shown further comprises a gate G104 for the purpose of control of the oscillator OSC. The gate 104 is supplied with a signal representative of a preset operation mode obtainable from the address memory 112, the re-write command signal obtainable from the subtractor 123 and the signal c obtainable from the terminal 3 of the shift register SR. The gate G104 is responsive to the signal c when the same is obtained at a time period other than the preset memory mode, or when the same is obtained at the time when the re-write command signal is not obtained, thereby to control the gate G105 to prevent the output of the flip-flop FF from disabling the oscillator OSC. Thus, the control logic unit 118 is responsive to operation of the respective switches 103, 104, 105 and 116 to provide various timing signals a to h necessary for control. Based on the above described basic understanding of the control logic unit 118, the operation of the FIG. 13 embodiment will be described in more detail by itemizing the operation into various operation modes.

Manual Selection Mode

Figure 18:
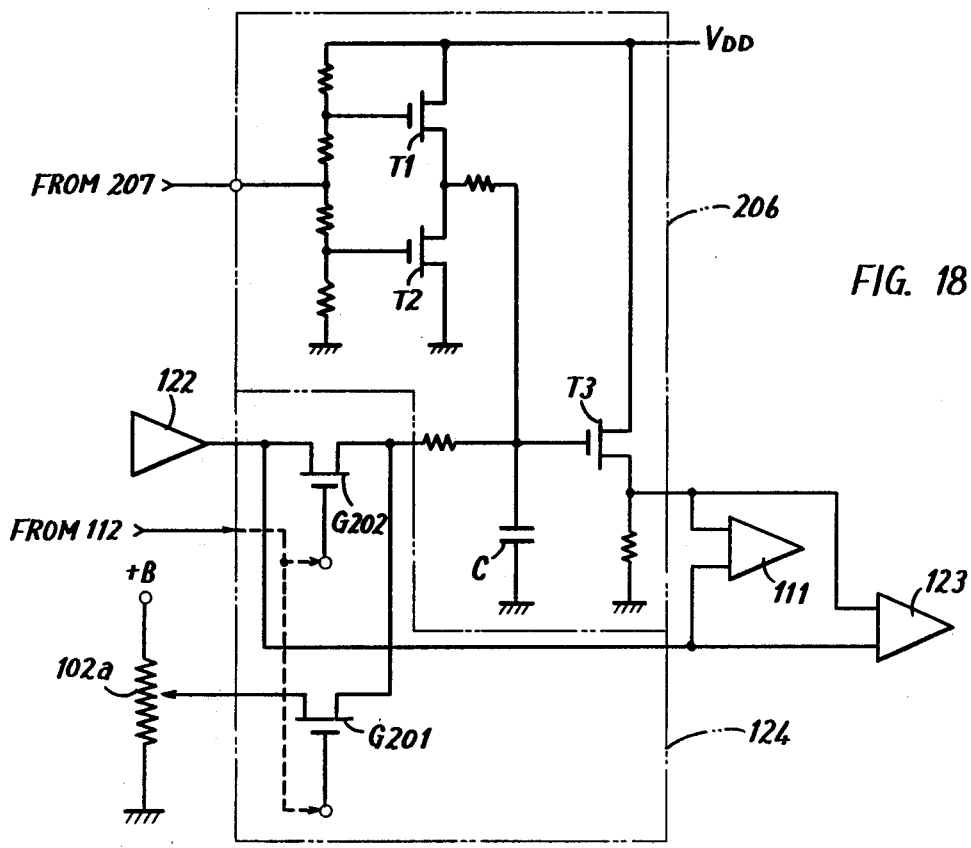
FIG. 18 shows in more detail the transfer gate and the buffer memory.

In the manual selection mode, first the manual selection switch 116 is operated. Upon operation of the switch 116, the control logic unit 118 is enabled and the operation of the manual selection switch 116 is stored in the address memory 112. More specifically, upon operation of the manual selection switch 116, the shift register SR of the control logic unit 118 is enabled and, as described previously, the timing signals a and b are withdrawn. Accordingly, the data transfer circuit 118a is responsive, to the timing signal b to receive a data transfer command (see FIG. 16(b)) fed from the control logic circuit 118, whereby the address data is applied to the address memory 112. At the same time, the write signal (see FIG. 16(a)) is obtained from the control logic unit 118 responsive to the timing signal a, whereby the address data is written in the address memory 112. The display driver circuit 117 is driven responsive to the read output from the address memory 112, whereby a light emitting diode 116a provided corresponding to the manual selection switch 117 is lightened by the display driver 117, thereby to display the manual selection mode. The output read from the address memory 112, i.e., the output reprsentative of the manual selection mode, is applied to a gate G201 of a transfer gate 124, which is shown in detail in FIG. 18 and will be described subsequently. Accordingly, the gate G201 is enabled and the tuning voltage obtained from the tuning voltage generator 102 is applied to a capacitor C of a buffer memory 206, which is shown in more detail in FIG. 18 and will be described subsequently. If and when the band selection switch 104 is operated in such situation, the data representing which band is selected is stored in the address memory 112, as done in case where the manual selection switch 116 was operated, and a light emitting diode 104a corresponding to the selected band is lighted. At that time, the control logic unit 118 has been responsive to the signal b from the shift register SR to be stopped from making a stepping operation, as described previously. In such a situation, if the tuning voltage is varied or scanned through manual operation of the variable resistor 102a constituting the voltage generator 102, the tuning voltage is written in the capacitor C of the buffer memory 206 through the gate G201 of the transfer gate 124. The output of the buffer memory 206 is applied as the tuning voltage to the tuner 201 comprising the variable capacitance diode through a field effect transistor T3 for impedance transformation, whereby manual selection is achieved.

Preset Memory Mode

Now description will be made of a preset memory mode wherein the tuning voltage as obtained through the manual selection operation is written in the data memories 107a and 107b. In the preset memory mode, first the preset memory switch 103 is operated. Upon operation of the preset memory switch 103, the operation of the switch 103 is stored in the address memory 112 responsive to the timing signals a and b obtained from the control logic unit 118, as done in the above described case. At the same time, the light emitting diode 103a corresponding to the preset memory switch is lighted. At that time, the gates G201 and G202 have been disabled responsive to the output read from the address memory 112. The gate G201 of the transfer gate 124 is rendered continually enabled in the manual reception mode and controlled to be disabled or rendered non-conductive in other operation modes. The gate G202 of the transfer gate 124 is controlled responsive to the output read from the address memory 112 such that the same is rendered conductive for a predetermined time period in the preset reception mode to be described subsequently upon depression of the band switch 104 and the preset selection switch 105 after the power supply switch is turned on, whereupon the same is reddered non-conductive.

The preset selection switch 105 is then operated. Responsive to the operation of the preset selection switch 105, the address memory 112 stores the data as to which channel is selected, as done in the above described case. At the same time, the light emitting diode 105a corresponding to the channel selected by the preset selection switch 105 is lighted. Since the band selection has been effected in the above described manual selection mode, the band addressing output and the preset channel addressing output are obtained from the address memory 112, whereby the data memories 107a and 107b are addressed responsive to these addressing outputs.

Figure 16:
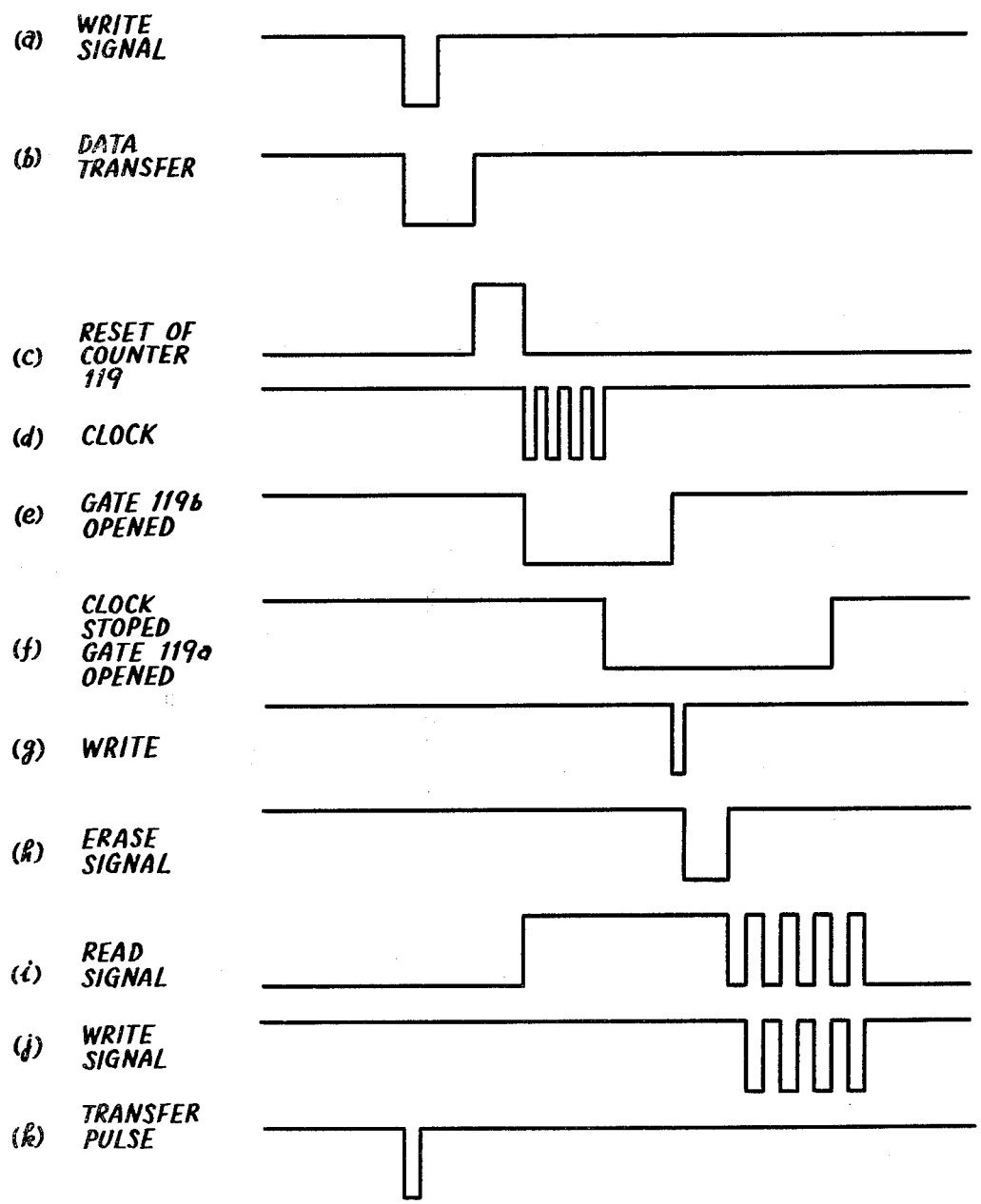
FIG. 16 shows waveforms for explanation of the FIG. 13 embodiment.

On the other hand, responsive to the operation of the preset selection switch 105, the reset signal of the counter 119 (see FIG. 16(c)) is obtained at the timing c following the timing signals a and b obtainable from the control logic unit 118, whereby the counter 119 is reset. Responsive to the following timing signal d, the clock pulse generator 121 is enabled. Accordingly, the clock pulses as shown in FIG. 16(d) are obtained from the clock pulse generator 121 and are applied to the clock terminal CK of the counter 119. Therefore, the counter 119 is responsive to the clock pulses from the clock pulse generator 121 to make a sequential stepping operation. Responsive to the timing signal e following the timing signal d, the gate circuit 119b is supplied with the data transfer command (see FIG. 16(e)). Therefore, the content in the counter 119 is applied to the digital-analog converter 120. Accordingly, the digital-analog converter 120 converts the content in the counter 119 as sequentially stepped responsive to the clock pulses into an analog output. Assumig that both the counter 119 and the digital-analog converter 120 are of a five-bit structure, the digital-analog converter 120 is responsive to the output of the counter 119 to provide a stepwise voltage having $32(=2^5)$ steps (see FIG. 17).

Figure 17:
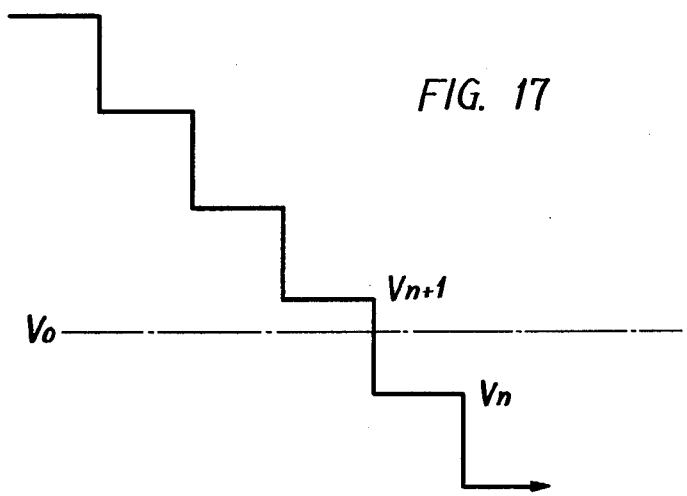
FIG. 17 shows a waveform for explanation of operation of the analog-digital conversion.

Now assuming that the tuning voltage as written in the capacitor C of the buffer memory 206 in the manual selection mode is $V_0$, as shown in FIG. 17, then the counting operation of the counter 119 is stopped if and when the output voltage of the digital-analog converter 120 changes from the value $V_{n+1}$ to the value $V_n$, as shown in FIG. 17, whereupon the value of the counter 119 is stored in the address of the digital data memory 107a as addressed by the address memory 112 by way of a rough tuning voltage. This will be described in more detail in the following. The output of the digital-analog converter 120 is applied to one input of the comparator 111 through the adder 120. On the other hand, the tuning voltage obtainable from the buffer memory 206 is applied to the other input of the comparator 111. Accordingly, the comparator 111 serves to compare these two input voltages and, if and when the output voltage from the digital analog converter 120 becomes lower than the tuning voltage, the output of the comparator 111 turns to the low level. Therefore, the clock pulses from the clock pulse generator 121 are stopped from being generated. See FIGS. 11(d) and (f).

The timing signal f is generated following the timing signal e in the control logic unit 118. The gate circuit 119a is enabled responsive to the timing signal f (see FIG. 16(f)), whereby the content in the counter 119 as stopped previously is applied to the digital data memory 107a. Thereafter the timing signal g is obtained from the control logic unit 118 and accordingly the write signal (see FIG. 16(g)) is applied to the digital data memory 107a. As a result, the content in the counter 119 is written in the address of the digital data memory 107a as addressed by the address memory 112. Thereafter the output as read from the data memory 107a is inputted to the digital-analog converter 120 and the output voltage from the digital-analog converter 120 is applied to the adder 122 as a rough tuning voltage.

The timing signal h is obtained following the timing signal g in the control logic unit 118, when the shift register SR is stopped from making a stepping operation. The erase/write/read voltage generator 109 is enabled responsive to the timing signal h. The erase/write/read voltage generator 109 first provides an erase signal (see FIG. 16(h)) to the analog data memory 107b serving as a memory for storing the data concerning the fine tuning voltage. Accordingly, the analog data memory 107b is erased, whereupon the analog data memory 107b is controlled to alternately and repetitively effect the read operation mode and the write operation mode responsive to the read signal (see FIG. 16(i)) and the write signal (see FIG. 16(j)) obtained from the erase/write/read voltage generator 109, thereby to achieve the write operation of the fine tuning voltage. The write operation of the fine tuning voltage is effected in the same manner as described with reference to the FIG. 5 embodiment and therefore a more detailed description is omitted. The output read from the analog data memory 107b, i.e. the fine tuning voltage, is applied to the above described adder 122.

The adder 122 eveluates the sum of the rough tuning voltage obtained from the digital-analog converter 120 and the fine tuning voltage obtained from the analog data memory 107b. The sum output from the adder 122 is applied to one input of the comparator 111 and is also applied to the transfer gate 124. The output of the comparator 111 turns from the low level to the high level (see FIG. 16(f)) if and when the output from the adder 122 becomes larger than the tuning voltage written in the buffer memory 206, whereby the write operation of a new fine tuning voltage to the analog data memory 107b is stopped. Thereafter, the analog data memory 107b is continually placed in the read operation mode (see FIG. 16(i)). At the same time, the preset memory mode is released. Thus, according to the embodiment shown, the tuning voltage to be written in the buffer memory 206 is divided into a rough tuning voltage and a fine tuning voltage, which are written in the digital data memory 107a and the analog data memory 107b, respectively.

Preset Selector Mode

In order to achieve the preset selection, the band selection switch 104 and the preset selection switch 105 are operated, as desired. In the preset selection mode, the shift register SR is stopped from making a stepping operation responsive to the timing signal c obtained in the control logic unit 118. The light emitting diodes 104a and 105a corresponding to the selected switches 104 and 105 are lighted responsive to the timing signals a and b and at the same time the address as determinable by the band selection switch 104 and the preset selection switch 105 is written in the address memory 112. The data is read out from the digital data memory 107a and the analog data memory 107b responsive to the addressing outputs from the address memory 112. The output as read from the digital data memory 107a is converted by the digital-analog converter 120 into an analog voltage by way of a rough tuning voltage which is applied to one input of the adder 122, while the output as read from the analog data memory 102b is applied to the other input of the adder 122 as a fine tuning voltage. In the preset selection mode, i.e. in a situation where the manual selection switch 116 is not operated, the gate G202 of the transfer gate 124 is rendered conductive for a predetermined time period (see FIG. 16(k)) responsive to the operation of the band selection switch 104 and the preset selection switch 105 and accordingly the output from the adder 122 at that time is written in the capacitor C of the buffer memory 206 as the tuning voltage. At that time, the gate G201 of the transfer gate 124 remains disabled or closed. The tuning voltage as written in the buffer memory 206 is corrected responsive to the signal from the automatic frequency control 207 and the tuning voltage, as corrected, is applied to the tuner 201. Correction of the tuning voltage obtained from the buffer memory responsive to the automatic frequency control is described in detail, particularly with reference to FIG. 4, in U.S. Pat. No. 3,986,154, entitled "Automatic Tuning Apparatus" and issued Oct. 12, 1976 to the same assignee as the present invention. Therefore, the above referenced patent is incorporated herein by reference thereto. Now such correction of the tuning voltage responsive to the automatic frequency control will be briefly described in the following. If and when the local oscillation frequency of the tuner 201 is shifted in the lower direction, the low level output is obtained from the automatic frequency control 207, thereby to render the field effect transistor T1 of the buffer memory 206 conductive, which increases the voltage across the capacitor C. On the contrary, assuming that the local oscillation frequency is shifted in the higher direction, the high level output is obtained from the automatic frequency control 207, which renders the field effect transistor T2 of the buffer memory 206 conductive, which decreases the voltage across the capacitor C. It is pointed out that the field effect transistor T3 is provided as a buffer for impedance transformation for the purpose of preventing a leak current from flowing from the capacitor C through the comparator 111 and the adder 123 and the voltage controlled variable capacitance diode and the like connected to the buffer memory 206.

Meanwhile, a transfer pulse (see FIG. 16(k)) is obtained responsive to the turning on of the power supply of the radio receiver. Accordingly, the gate G202 of the transfer gate 124 is enabled or opened and the rough tuning voltage is read from the digital data memory 107a and thus from the digital-analog converter 120 and the fine tuning voltage is read from the analog data memory 107b. At that time, the address of the digital data memory 107a and the address of the analog data memory 107b are determined by the addressing outputs read from the address memory 112 corresponding to the channel which was received before the power supply is turned off. Thus, even after the power supply of the radio receiver is turned off, the same channel as received before the power supply was turned off can be received after the power supply of the radio receiver is turned on again.

Re-Write of the Tuning Voltage

In the above described preset selection mode, the rough tuning voltage and the fine tuning voltage as read from the data memories 107a and 107b, respectively, are written in the buffer memory 206 through the adder 122 and the transfer gate 124, whereupon the tuning voltage is corrected responsive to the automatic frequency control signal obtainable from the automatic frequency control 207 and the tuning voltage, as corrected, is applied to the tuner 201 by way of the actual tuning voltage. The above described actual tuning voltage to be supplied to the tuner 201 is also applied to one input of the subtractor 123. The other input of the subtractor 123 is supplied with the output voltage from the adder 122 described previously, i.e., the tuning voltage from the memories. The subtractor 123 serves to provide a signal for the re-write operation control to the control logic unit 118, if and when the difference between the actual tuning voltage obtainable from the buffer memory 206 and the tuning voltage obtained from the adder 122 responsive to the data memories 107a and 107b exceeds a predetermined value. Accordingly, the control logic unit 118 is controlled to initiate the stepping operation of the shift register SR. Therefore, as described in conjunction with the preset memory mode, the actual tuning voltage, as corrected responsive to the automatic frequency control signal, is re-written in the digital data memory 107a and the analog data memory 107b responsive to the various timing signals a to h obtainable from the shift register SR.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A preset tuning apparatus adapted for selecting a preset channel, comprising:

non-volatile analog storage means including a floating gate type field effect semiconductor memory device, said floating gate type field effect semiconductor memory device comprising a semiconductor substrate of one conductivity type having a main surface, source and drain regions of the opposite conductivity type spaced apart on said main surface of said semiconductor substrate, a first insulating layer formed on said main surface of said semiconductor substrate at least in an area between said source and drain regions, a floating gate electrode formed on said first insulating layer above said area on said main surface between said source and drain regions, a second insulating layer formed on said floating gate electrode, and a control gate electrode formed opposite to said floating gate electrode, on said second insulating layer, said floating gate type field effect semiconductor memory device exhibiting a change in the control gate voltage versus drain current characteristic as a function of the type and quantity of electric charge applied to said floating gate electrode, first voltage applying means for selectively applying an erase voltage to said semiconductor memory device in an erase operation mode for causing a first change to a predetermined value in one direction in quantity of electric charge applied to said floating gate electrode, whereby a respective first change in said control gate voltage versus drain current characteristic of said semiconductor memory device is caused, second voltage applying means for selectively applying a write voltage to said semiconductor memory device in a write operation mode for causing a second change to a value to be preset in the opposite direction in quantity of electric charge applied to said floating gate electrode, whereby a respective second change in said control gate voltage versus drain current characteristic of said semiconductor memory device is caused, said second change being associated with the value being preset in quantity of electric charge and being in the direction opposite to said first change, third voltage applying means for selectively applying a read voltage to said semiconductor memory device in a read operation mode for withdrawing an analog electrical signal representative of a drain current determinable as a function of said value being preset in quantity of electric charge in said floating gate electrode in terms of said control gate voltage versus drain current characteristic of said semiconductor memory device, first tuning voltage providing means operatively coupled to said third voltage applying means for providing a first tuning voltage associated with said analog electrical signal representative of a drain current determinable as a function of said value being preset in quantity of electric charge in said floating gate electrode in terms of said control gate voltage versus drain current characteristic of said semiconductor memory device, and tuning means comprising voltage controlled variable reactance means connected to receive said first tuning voltage from said first tuning voltage providing means, said value to be preset being preselected for enabling selection by said tuning means of said preset channel.

2. A preset timing apparatus adapted for selecting a preset channel in accordance with claim 1, which further comprises second tuning voltage providing means for selectively providing a second tuning voltage to said voltage controlled variable reactance means of said tuning means, and means coupled to said second tuning voltage providing means for changing said second tuning voltage selectively provided to said voltage control variable reactance means for enabling selection of a desired channel by said tuning means.

3. A preset tuning apparatus adapted for selecting a preset channel in accordance with claim 2, which further comprises
means responsive to said first tuning voltage from said first tuning voltage providing means and said second tuning voltage from said second tuning voltage providing means for controlling said second voltage applying means for causing said second change in quantity of electric charge applied to said floating gate electrode to a value corresponding to said second tuning voltage from said second tuning voltage providing means.

4. A preset tuning apparatus adapted for selecting a preset channel in accordance with claim 3, wherein said means for controlling said second voltage applying means comprises
alternate and repetitive control means for controlling said second voltage applying means and said third read voltage applying means for alternately and repetitively causing said write operation mode and said read operation mode for a predetermined short time period for each mode, said second write voltage applying means being adapted such that a predetermined small value of said second change in quantity of electric charge is caused in each write operation mode period, and
means responsive to said first and second tuning voltages for detecting coincidence of said first and second tuning voltages for disabling said alternate and repetitive control means.

5. A preset tuning apparatus adapted for selecting a preset channel in accordance with claim 1, wherein said preset tuning apparatus is adapted for selecting a desired preset channel among a plurality of preset channels, and said non-volatile analog storage means comprises a plurality of floating gate type field effect semiconductor memory devices allotted to said plurality of channels, and which further comprises
channel selecting means, and
means responsive to said channel selecting means for addressing a corresponding one of said plurality of semiconductor memory devices.

6. A preset tuning apparatus adapted for selecting a preset channel in accordance with claim 5, which further comprises means for operatively coupling said plurality of semiconductor memory devices commonly to said first, second and third voltage applying means and to said first tuning voltage providing means.

7. A preset tuning apparatus adapted for selecting a preset channel in accordance with claim 5, wherein said plurality of channels are divided into a plurality of groups, each corresponding to a frequency band, and which further comprises
band selecting means, and
means responsive to said band selecting means for addressing a corresponding one of said plurality of groups of said semiconductor memory devices.

8. A preset tuning apparatus adapted for selecting a preset channel in accordance with claim 4, wherein said second voltage applying means comprises means responsive to said second tuning voltage from said second tuning voltage providing means for generating a write voltage close to that smaller than the write voltage corresponding to said second tuning voltage.

9. A preset tuning apparatus adapted for selecting a preset channel in accordance with claim 5, wherein said addressing means comprises switching means operable responsive to said channel selecting means.

10. A preset tuning apparatus adapted for selecting a preset channel in accordance with claim 9, wherein said switching means comprises a field effect device.

11. A preset tuning apparatus adapted for selecting a preset channel in accordance with claim 7, wherein said addressing means comprises switching means operable responsive to said band selecting means.

12. A preset tuning apparatus adapted for selecting a preset channel in accordance with claim 11, wherein said switching means comprises a field effect device.

13. A preset tuning apparatus adapted for selecting a preset channel in accordance with claim 4, which further comprises
write operation commanding means, and
means responsive to said write operation commanding means for enabling said first voltage applying means.

14. A preset tuning apparatus adapted for selecting a preset channel in accordance with claim 13, which further comprises means coupled to said alternate and repetitive control means for enabling said alternate and repetitive control means after said erase operation mode.

15. A preset tuning apparatus adapted for selecting a preset channel in accordance with claim 3, which further comprises
first value data providing means responsive to said second tuning voltage providing means for providing first value data representing in a rough manner an approximate value of said second tuning voltage from said second tuning voltage providing means,
second value data providing means responsive to said first value data providing means and said second tuning voltage providing means for providing second value data representing in a fine manner the difference between the actual value of said second tuning voltage and said approximate value of said second tuning voltage,
further storage means coupled to said first value data providing means for storing said first value data, and
means coupled to said further storage means for providing a further voltage associated with said first value data,
said non-volatile analog storage means being adapted for storing said second value data as said value being preset,
said first tuning voltage providing means comprising means for incorporating said further voltage to said first tuning voltage.

16. A preset tuning apparatus adapted for selecting a present channel in accordance with claim 15, wherein said first value data providing means comprises
clock pulse generating means for generating clock pulses,
counter means coupled to said clock signal generating means for providing a count value as said first value data, and
comparator means coupled to said further voltage providing means and said second tuning voltage providing means for detecting approximation of said further voltage and said second tuning voltage for disabling said clock signal generating means,
said further voltage providing means being selectively coupled to said counter means on the occasion of said first value data providing means being operating, said further storage means being adapted for storing said count value from said counter means as said first value data.

17. A preset tuning apparatus adapted for selecting a preset channel in accordance with claim 16, wherein said means coupled to said further storage means for providing a further voltage associated with said first value data comprises digital-analog converting means for converting said count value into said further voltage associated with said count value.

18. A preset tuning apparatus adapted for selecting a preset channel in accordance with claim 17, wherein said means for incorporating said further voltage to said first tuning voltage comprises adder means for adding said further voltage to said first tuning voltage.

19. A preset tuning apparatus adapted for selecting a preset channel in accordance with claim 18, wherein said second value data providing means comprises means for evaluating the sum of said further voltage and said first tuning voltage, and means for detecting said sum reaching said second tuning voltage.

20. A preset tuning apparatus adapted for selecting a preset channel in accordance with claim 3, which further comprises selection gate means selectively coupled to said first and second tuning voltage providing means, and voltage storing means coupled to said selection gate means for storing a voltage selectively provided from said first and second tuning voltage providing means for providing said stored voltage to said voltage controlled variable reactance means of said tuning means as a tuning voltage.

21. A preset tuning apparatus adapted for selecting a preset channel in accordance with claim 20, which further comprises automatic frequency control means coupled to said voltage storing means for correcting said stored voltage for automatic frequency control.

22. A preset tuning apparatus adapted for selecting a preset channel in accordance with claim 21, which further comprises means coupled to said voltage storing means and said means for incorporating said further voltage to said first tuning voltage for detecting the difference between said first tuning voltage from said means for incorporating said further voltage to said first tuning voltage and said stored voltage from said voltage storing means exceeding a predetermined value, and means responsive to said difference detecting means for enabling said second voltage applying means for achieving a new write operation when said difference exceeds said predetermined value.

* * * * *